United States Patent
Orthner et al.

(10) Patent No.: US 10,936,525 B2
(45) Date of Patent: Mar. 2, 2021

(54) FLEXIBLE ROUTING OF NETWORK DATA WITHIN A PROGRAMMABLE INTEGRATED CIRCUIT

(71) Applicant: Achronix Semiconductor Corporation, Santa Clara, CA (US)

(72) Inventors: Kent Orthner, Santa Clara, CA (US); Travis Johnson, Santa Clara, CA (US); Quinn Jacobson, Santa Clara, CA (US); Sarma Jonnavithula, Bangalore (IN)

(73) Assignee: Achronix Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 16/852,967

(22) Filed: Apr. 20, 2020

(65) Prior Publication Data

US 2020/0356514 A1   Nov. 12, 2020

Related U.S. Application Data

(63) Continuation-in-part of application No. 16/409,191, filed on May 10, 2019, now Pat. No. 10,707,875.

(60) Provisional application No. 62/982,223, filed on Feb. 27, 2020.

(51) Int. Cl.
   *H03K 19/177* (2020.01)
   *G06F 13/40* (2006.01)
   *H03K 19/17736* (2020.01)

(52) U.S. Cl.
   CPC ... *G06F 13/4068* (2013.01); *H03K 19/17744* (2013.01)

(58) Field of Classification Search
   CPC .................. G06F 13/4068; H03K 19/17744
   See application file for complete search history.

(56) References Cited

U.S. PATENT DOCUMENTS

| | | | |
|---|---|---|---|
| 7,568,064 | B2 | 7/2009 | Reblewski |
| 9,294,419 | B2 | 3/2016 | Hasenplaugh et al. |
| 9,405,713 | B2 | 8/2016 | Stark et al. |
| 10,116,557 | B2 | 10/2018 | Gray |
| 10,187,064 | B1 | 1/2019 | Atsatt et al. |
| 10,318,723 | B1 | 6/2019 | Paczkowski et al. |
| 10,346,346 | B1 | 7/2019 | Arbel et al. |

(Continued)

OTHER PUBLICATIONS

"U.S. Appl. No. 16/409,146, Ex Parte Quayle Action dated Sep. 3, 2019", 5 pgs.

(Continued)

*Primary Examiner* — Kurtis R Bahr
(74) *Attorney, Agent, or Firm* — Schwegman Lundberg & Woessner, P.A.

(57) ABSTRACT

Methods, systems, and computer programs are presented for distributing Ethernet packets at a Field Programmable Gate Array (FPGA). One programmable integrated circuit includes: an iNOC comprising iNOC rows and iNOC columns; a set of clusters coupled to the iNOC, each cluster comprising a vertical network access point (NAP) for iNOC column communications, a horizontal NAP for iNOC row communications, a valid signal, and programmable logic, where the vertical NAP is connected to the horizontal NAP when the valid signal is activated; and an Ethernet controller coupled to the iNOC, the Ethernet controller configurable to send Ethernet-packet segments to the vertical NAPs.

20 Claims, 26 Drawing Sheets

(56) References Cited

U.S. PATENT DOCUMENTS

| | | | |
|---|---|---|---|
| 10,608,640 | B1 | 3/2020 | Orthner et al. |
| 2009/0125574 | A1 | 5/2009 | Mejdrich et al. |
| 2009/0245257 | A1* | 10/2009 | Comparan ............. H04L 45/00 370/392 |
| 2010/0191814 | A1 | 7/2010 | Yeo et al. |
| 2011/0093854 | A1* | 4/2011 | Blanc ................... G06F 9/5066 718/101 |
| 2012/0099475 | A1 | 4/2012 | Tokuoka |
| 2012/0227026 | A1 | 9/2012 | Goldman et al. |
| 2013/0160026 | A1 | 6/2013 | Kuesel et al. |
| 2016/0344629 | A1 | 11/2016 | Gray |
| 2016/0359973 | A1 | 12/2016 | Loh et al. |
| 2017/0063625 | A1 | 3/2017 | Philip et al. |
| 2018/0227180 | A1* | 8/2018 | Rao ........................ G06F 15/76 |
| 2018/0287964 | A1* | 10/2018 | Gray .................... H04L 49/109 |
| 2019/0227963 | A1 | 7/2019 | Ooi et al. |

OTHER PUBLICATIONS

"U.S. Appl. No. 16/409,146, Notice of Allowance dated Dec. 9, 2019", 5 pgs.

"U.S. Appl. No. 16/409,146, Response filed Oct. 2, 2019 to Ex Parte Quayle Action dated Sep. 3, 2019", 3 pgs.

"U.S. Appl. No. 16/409,191, Non Final Office Action dated Dec. 11, 2019", 22 pgs.

"U.S. Appl. No. 16/409,191, Notice of Allowance dated Mar. 3, 2020", 16 pgs.

"U.S. Appl. No. 16/409,191, Response filed Jan. 27, 2020 to Non Final Office Action dated Dec. 11, 2019", 16 pgs.

\* cited by examiner

2400

```
┌─────────────────────────────────────┐
│ RECEIVE, AT A PROGRAMMABLE          │ ~2402
│ INTEGRATED CIRCUIT, A               │
│ CONFIGURATION FOR THE               │
│ PROGRAMMABLE INTEGRATED CIRCUIT,    │
│ THE PROGRAMMABLE INTEGRATED         │
│ CIRCUIT COMPRISING:                 │
│   AN INTERNAL NETWORK ON CHIP       │
│ (INOC) COMPRISING INOC ROWS AND     │
│ INOC COLUMNS;                       │
│   A PLURALITY OF CLUSTERS COUPLED   │
│ TO THE INOC; AND                    │
│ AN ETHERNET CONTROLLER COUPLED      │
│ TO THE INOC, THE ETHERNET           │
│ CONTROLLER CONFIGURABLE TO          │
│ OPERATE IN PACKET MODE WHERE        │
│ EACH COMPLETE INBOUND ETHERNET      │
│ PACKET IS SENT FROM THE ETHERNET    │
│ CONTROLLER TO ONE OF THE NAPS VIA   │
│ THE INOC                            │
└─────────────────────────────────────┘
```

```
┌─────────────────────────────────────┐
│ PROVIDE ETHERNET COMMUNICATIONS     │~2404
│  FOR THE PLURALITY OF CLUSTERS VIA  │
│       THE ETHERNET CONTROLLER       │
└─────────────────────────────────────┘
```

```
RECEIVE, AT A PROGRAMMABLE                                    ~2502
INTEGRATED CIRCUIT, A
CONFIGURATION FOR THE
PROGRAMMABLE INTEGRATED CIRCUIT,
THE PROGRAMMABLE INTEGRATED
CIRCUIT COMPRISING:
   AN INTERNAL NETWORK ON CHIP
(INOC) COMPRISING INOC ROWS AND
INOC COLUMNS;
   A PLURALITY OF CLUSTERS COUPLED
TO THE INOC, EACH CLUSTER
COMPRISING A VERTICAL NETWORK
ACCESS POINT (NAP) FOR INOC
COLUMN COMMUNICATIONS, A
HORIZONTAL NAP FOR INOC ROW
COMMUNICATIONS, A VALID SIGNAL,
AND PROGRAMMABLE LOGIC; AND
    AN ETHERNET CONTROLLER
COUPLED TO THE INOC
```

PROVIDE ETHERNET COMMUNICATIONS ~2504
FOR THE PLURALITY OF CLUSTERS VIA
THE ETHERNET CONTROLLER

FLEXIBLE ROUTING OF NETWORK DATA WITHIN A PROGRAMMABLE INTEGRATED CIRCUIT

CLAIM OF PRIORITY

This application is a Continuation-in-part Application of U.S. patent application Ser. No. 16/409,191, entitled "Reconfigurable Programmable Integrated Circuit with On-Chip Network," filed May 10, 2019, and is herein incorporated by reference in its entirety.

This application also claims priority from U.S. Provisional Patent Application No. 62/982,223, entitled "Processing of Ethernet Packets at a Programmable Integrated Circuit," filed Feb. 27, 2020, and is herein incorporated by reference in its entirety.

TECHNICAL FIELD

The subject matter disclosed herein generally relates to methods, systems, and machine-readable storage media for providing on-chip networking inside a Field Programmable Gate Array (FPGA).

BACKGROUND

FPGAs are increasingly being used for applications that require high-speed data communications, such as machine learning, networking acceleration, and storage acceleration. FPGAs may include high-frequency and high-throughput interfaces, but the internal capabilities of the FPGA are lacking for handling high throughputs due to the lower operating frequencies of the user logic in the FPGA core.

FPGAs are commonly used for networking applications, including packet switches and routers, deep packet inspection, compression, and encryption. Modern FPGAs support very high-throughput Ethernet networking interfaces such as 400 Gbps Ethernet to support these applications at these data rates.

With traditional FPGAs, the networking IP cores that support high-speed interfaces are located at the boundary of the FPGA core, and the FPGA developer must develop logic that provides a path from the FPGA boundary to the functional unit within the FPGA. The logic that supports the networking application is typically crowded around the networking interface, leading to significant congestion issues, and making it difficult to meet timing requirements.

BRIEF DESCRIPTION OF THE DRAWINGS

Various of the appended drawings merely illustrate example embodiments of the present disclosure and cannot be considered as limiting its scope.

FIG. 24 is a flowchart of a method for processing Ethernet packets at an FPGA, according to some example embodiments.

FIG. 25 is a flowchart of a method for distributing Ethernet packets at the FPGA, according to some example embodiments.

DETAILED DESCRIPTION

Figure 1:
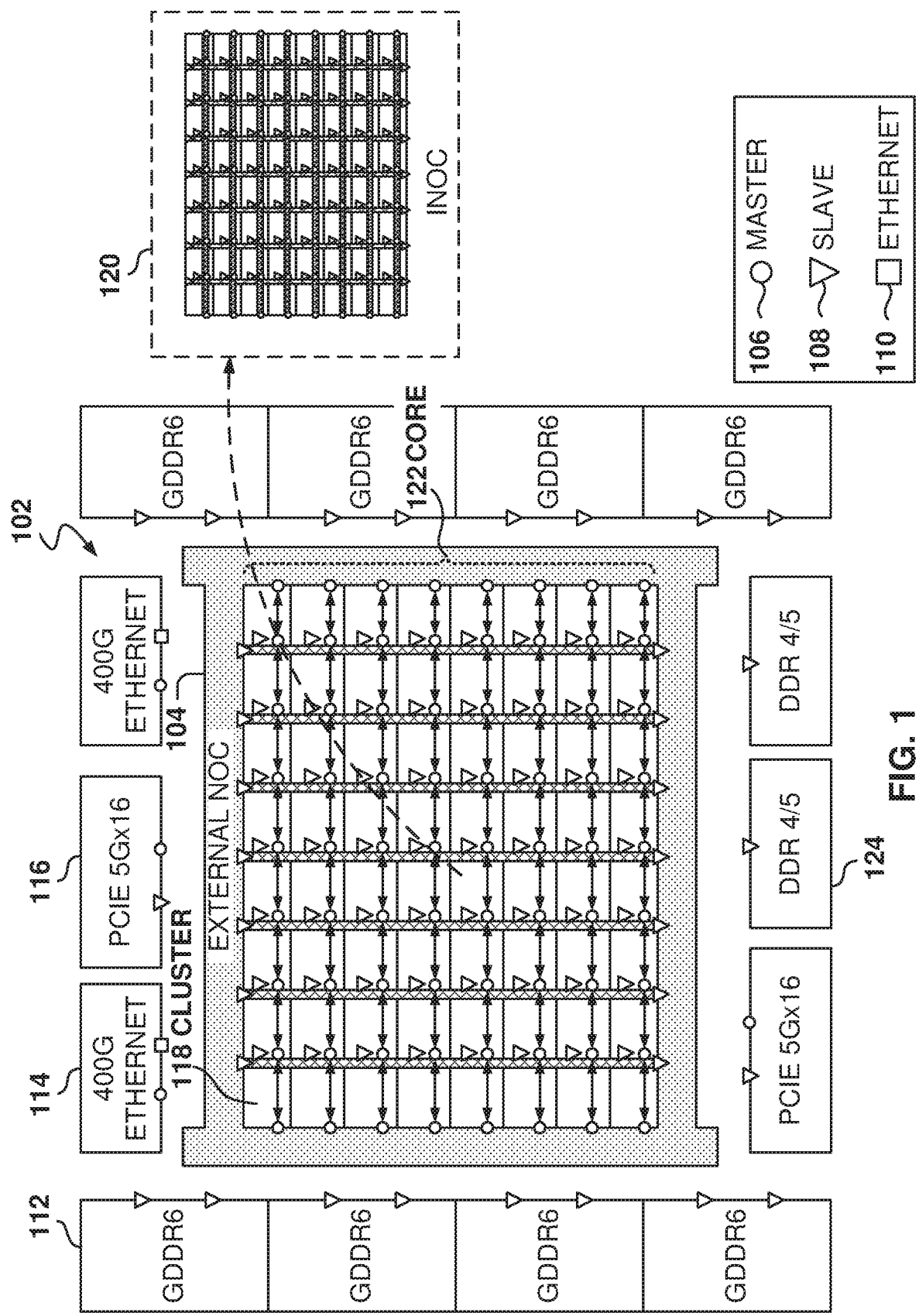
FIG. 1 illustrates the architecture of an FPGA with on-chip networking capabilities, according to some example embodiments.

Example methods, systems, and computer programs are directed to processing Ethernet packets at an FPGA.

Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

To support a fast network interface, such as a 400 Gbps Ethernet interface (also referred to as 400G Ethernet), the data path inside the FPGA would have to be, for example, 1024 bits wide and operate at frequencies in excess of 720 MHz. These performance goals are practically impossible in traditional FPGAs.

In one aspect, methods and systems are presented for a dedicated network inside an FPGA core to efficiently load-balance Ethernet traffic between multiple access points in the FPGA fabric, and to deliver or accept Ethernet data from anywhere within the FPGA core without requiring the FPGA designer to implement the data movement registers in FPGA logic. Furthermore, the FPGA network interface rearranges the packet data when presenting it to the FPGA logic so that typical data paths at common clock speeds can be utilized at the core, such as a 256-bit wide data path operating at 506 MHz.

The embodiments presented herein are presented for Ethernet networks at different speeds, such as 400G, 200G, and 100G, but the same principles may be applied to other data-handling network interfaces and other networking speeds. For example, as technology improves and faster Ethernet modes become available, the same principles can be used to implement these faster modes.

The improved network handling capabilities at the FPGA include, at least, the ability to send Ethernet traffic down the columns of the internal FPGA network to any row; support a variety of Network Access Points (NAP) arrangements for versatile development of FPGA designs; within-column quad segment interface (QSI) to reduce transport frequency; a packet mode to deliver an Ethernet packet to a single NAP to reduce transport frequency and simplify FPGA design; in-column packet interleaving to reduce per-node buffering requirements; buffer fill-level reporting; cut-through mode to start forwarding packet before complete packet has been received; support for a mix of 400G, 200G, and 100G Ethernet traffic; multi-hop packet forwarding within internal FPGA network; and packet compression using multicast techniques.

One general aspect includes a programmable integrated circuit that includes: an internal network on chip (iNOC) comprising iNOC rows and iNOC columns; clusters coupled to the iNOC, each cluster comprising a network access point (NAP) and programmable logic; and an Ethernet controller coupled to the iNOC. The Ethernet controller is configurable to operate in packet mode where each complete inbound Ethernet packet is sent from the Ethernet controller to one of the NAPs via the iNOC, wherein one or more NAPs are configurable to receive the complete inbound Ethernet packets from the Ethernet controller.

One general aspect includes a programmable integrated circuit that includes: an iNOC comprising iNOC rows and iNOC columns; a plurality of clusters coupled to the iNOC, each cluster comprising a vertical network access point (NAP) for iNOC column communications, a horizontal NAP for iNOC row communications, a valid signal, and programmable logic, where the vertical NAP is connected to the horizontal NAP when the valid signal is activated; and an Ethernet controller coupled to the iNOC, the Ethernet controller configurable to send Ethernet-packet segments to the vertical NAPs.

FIG. 1 illustrates the architecture of an FPGA 102 with on-chip networking capabilities, according to some example embodiments. The FPGA 102 includes an external NOC (eNOC) 104 and an internal NOC (iNOC) 120, which provide high-throughput and easy-to-use access between peripherals and the FPGA core 122. The combination of iNOC 120 and eNOC 104 are referred to herein as the NOC. The FPGA core 122 is surrounded by the eNOC 104 and includes the clusters 118, which are units of programmable logic configurable by the user.

In a typical FPGA, it may be difficult to move data quickly because the FPGA logic runs slower than typical dedicated processing logic. The NOC implements a hierarchy of networks that allows high throughput and fast data movement inside the FPGA.

There is a plurality of external interfaces that exchange data with the outside of the FPGA 102, such as Ethernet controller 114, PCIe controller 116, and GDDR6 controller 112. In a traditional FPGA, the external interfaces are connected directly to the clusters 118 and the ability to transfer data is then limited by the speed of the clusters 118 and the network bandwidth available to send data to the clusters 118. Further, data exchange may require consuming a large number of clusters 118. For example, if the PCIe controller 116 wants to talk to DDR-4/5 controller 124, the user has to design the FPGA to carry read and write requests all the way across the fabric, in both directions, and this would require the use of a large amount of user logic that may not be used for other purposes. Further, the transfer would be slow when compared to the speeds supported by the external interfaces.

In some example embodiments, the eNOC 104 and the iNOC 120 support read/write transactions between masters and slaves. Master/slave is a model of communication where one device or process has control over one or more other devices. In the FPGA 102, the master is able to initiate transactions, i.e., send requests, while the slave waits for any master to send a request. The eNOC 104 also supports cut-through and store-and-forward communications.

The masters include, at least, PCIe controller 116, user-implemented masters in the FPGA core 122, and a FPGA control unit (FCU) (allowing bitstream commands to read and write peripheral control and status (CSR) interfaces). The slaves include, at least, GDDR6 controllers 112, DDR-4/5 controllers 124, user-implemented slaves in the FPGA core 122, PCIe controller 116, the FCU (allowing masters in the subsystem, such as PCIe, to configure the FPGA 102), and CSR interfaces of clusters 118 (e.g., including phase lock loops (PLLs), Input/Outputs, top-level clock/reset).

In some example embodiments, the iNOC 120 is implemented with regularly-spaced elements in the FPGA core 122, and the iNOC 120 includes a plurality of columns and a plurality of rows. The example illustrated in FIG. 1 includes seven columns and eight rows, but other embodiments may use a different number of columns and rows (e.g., in the range from 1 to 50 or more, although other values are also possible).

In some example embodiments, each row includes a fast data path (e.g., 512 Gbps, but other speeds are also possible) in the eastbound and westbound directions, and each column includes a fast data path in the northbound and the southbound directions.

The iNOC 120 and eNOC 104 transport packets and provide a packet-transfer interface to the modules using the NOC. In some example embodiments, the packet interface supports Advanced Extensible Interface (AXI) read and write transactions. AXI is part of the Advanced Microcontroller Bus Architecture (AMBA), which is an open-standard, on-chip interconnect specification for the connection and management of functional blocks in system-on-a-chip (SoC) designs.

The user logic in the cluster 118 can issue AXI read or write transactions to a local network access point (NAP) in the cluster 118. Based on the routing logic, the iNOC 120 carries the transaction to the eNOC 104 at the east or west boundary of the FPGA core 122. In some example embodiments, the iNOC 120 transports transactions issued by user FPGA logic to the east or west, and transactions destined to the FPGA user logic arrive from the north or south, but other traffic patterns may also be supported.

In one embodiment with 512 Gbps transport on the iNOC 120, assuming 4-cycle bursts, each iNOC row is able to support 409 Gbps of write data throughput, since the write command is sent as the first cycle of each transaction. Larger-size bursts will result in higher throughput, and smaller-size bursts will result in lower throughput. The transactions on each row or column share the available bandwidth with other transactions on the same row or column.

Each column of the iNOC 120 operates similar to the rows, except packet data is carried in the northbound or southbound directions. In some example embodiments, the horizontal component of the iNOC 120 allows the user logic in cluster 118 to issue read/write transactions (e.g., AXI transactions), and the vertical component of the iNOC 120 allows IP components outside of the FPGA core 122 to issue transactions to the clusters 118. In other words, the FPGA masters 106 connect to the rows of the iNOC 120, and the FPGA slaves 108 connect to the columns of the iNOC 120.

The iNOC 120 supports multiple traffic types, including transaction data and packet data streams. The transaction data includes read and write commands, data, and responses. The command transfers are typically a single cycle, and data transfers are typically short, with 4-cycle transactions being common.

The traffic types include Cache Coherent Interconnect for Accelerators (CCIX) data, packet data, and raw user data. In some example embodiments, the iNOC 120 carries CCIX data from the PCIe controller 116 when working in CCIX mode. This is presented to the user as a CSX-protocol formatted data stream, which is effectively a segmented interface that the user unpacks.

The packet data may be bundled as longer streams of data. In some example embodiments, the iNOC 120 imposes no upper limit on packet sizes. Further yet, with regards to raw user data transport, the iNOC 120 transports flits between NAPs within the same column or the same row, and the flits are combined to form the packets.

In some example embodiments, each row of the iNOC 120 presents a master 106 to the eNOC 104 on the west side of the FPGA core 122, and another master 106 on the east side of the FPGA core 122. Each column of the iNOC 120 presents a slave 108 to the iNOC 120 on the north side and another one on the south side. This allows user logic to read or write any external IP or CSR interface, and allows any external IP with a master interface to access any NAP with attached user logic.

In some example embodiments, the eNOC 104 is a ring around the FPGA core 122 that carries transactions from the outside of the eNOC 104 to the clusters 118, and vice-versa, as well as between clusters 118. In some example embodiments, the eNOC 104 provides address decoding, transaction command and response routing, message-width adaptation, frequency adaptation (e.g., clock domain crossing), burst adaptation, and protocol conversion.

The eNOC 104 carries read and write transactions. In some example embodiments, the eNOC 104 does not carry Ethernet packets, SerDes data, or CCIX data, and does not carry interrupt information. However, other embodiments may transport one or more of Ethernet packets, Serdes data, CCIX data, and carry interrupt information.

The combination of iNOC 120 and eNOC 104 is such that any access point in the FPGA 102 has access to any interface IP slave interface, including any of the GDDR6 controller 112, DDR-4/5 controller 124, and PCIe controller 116 interfaces.

In some example embodiments, each memory interface presents a slave (e.g., with a data path width of 256b) to the NOC and accepts read and write transactions. Further, PCIe masters 106 and slaves 108 are connected directly to the eNOC 104.

A NOC node, or simply referred to herein as a node, is a component of the network that is connected, and in communication with, other nodes. Each node comprises, for each direction of traffic, a router and a NAP. The NAP has the connections to the local user logic in the cluster 118 and the router carries packets (e.g., flits) to other routers in other nodes. Thus, user logic accesses the NOC by communicating with the NAP that interfaces with the router.

The router makes routing decisions for the flits travelling on the network and the NAP "slows" the transfer of data from the high-speed NOC network to the lower speeds of the user logic in the cluster 118. The NAP also formats the data into the corresponding protocol, such as Ethernet or AXI. An EW (east-west) router is a router in the east-west direction, that is, a router in the rows of the iNOC 120. A NS (north-south) router is a router in the north-south direction, i.e., a router in the columns of the iNOC 120.

CXS, or CXS interface, refers to the CCIX Stream Interface. A Graphics Dual Data Rate Memory (GDDR), or GDDR6, is a memory unit (JEDEC standard 6.0 is inferred unless specified otherwise). A Dual Data Rate Memory (DDR), or DDR4, is a memory unit (JEDEC standard 4.0 is inferred unless specified otherwise). A WAW flit is a special kind of flit encapsulating both write data channel and write address channel in the same flit, allowing for more efficient data transport. The Ethernet Interfacing Unit (EIU) is the interface that sends Ethernet data to iNOC columns. Further, a CCIX Interfacing Unit (CXIU) is the interface that sends CXS data to iNOC columns.

Each node has two sets of router and NAP combinations: an EW router and NAP, and an NS router and NAP. Further, the router at each node is independent from other routers and drives incoming flits to either the next node (next router) or towards the corresponding local NAP. Each router decides if the flit is consumed in the node or forwarded to the next node based on a destination ID field in the flit. In some example embodiments, the flit has a 12-bit transport information and a 291-bit payload, but other formats are possible. The flit payload is utilized to carry various types of data, and in the case of AXI transactions, the 291-bit payload carries AXI signals. In non-AX flits, the flits are configured to encapsulate raw data, Ethernet packets, or CXS streams. Multiple flit formats are supported for different types of loads.

In the case of AXI transactions, the EW router is attached to the EW NAP which acts as an AXI slave to the user logic. The NS router is attached to the NS NAP which acts as an AXI master over the user logic. Hence, the EW direction generates requests and receives responses while the NS direction receives commands and generates responses.

In the case of raw data transfers, the EW NAP generates raw data flits, which are received by another EW NAP. The transfer happens through the EW iNOC. Similarly, the NS NAP generates a raw data flit and is received by another NS NAP.

In the case of CXS flits, the NS NAP receives and generates the CXS flits, where each CXS flit encapsulates a CXS stream and is carried through the NS iNOC infrastructure towards the CXIU, which interfaces with PCIe or CCIX.

In the case of Ethernet flits, the NS NAP receives and generates the Ethernet packets. Each Ethernet flit encapsulates an Ethernet packet in full or in part. The iNOC infrastructure carries the data to the EIU, which handles the interfacing with the Ethernet MAC. This way, the iNOC 120 supports both memory-mapped data-transport infrastructure as well as pure data-stream-transport infrastructure.

Thus, the NOC provides a high-speed network that runs around the outside of the user logic, using very fast links (e.g., 2 gigahertz) that are thousands of bits wide, resulting in much lower latency and much higher throughput path to that memory without the user having to design any intermediate cluster 118 for communications. Thus, the FPGA may be unprogrammed and the PCIe controller 116 is able to talk to the DDR-4/5 controller 124 without any FPGA configuration. This allows the better use of user logic for the user's programmable functions.

In some example embodiments, the NOC is a transaction network that supports reads and writes. A read may be requested from any address and a write may be performed to any address.

To benefit from the NOC functionality, the user instantiates and configures a NAP in their design. To access the variety of IP visible through the NOC, the user configures the NAP. Further, to use the NOC to communicate between clusters 118 on the FPGA 102, the user instantiates NAP blocks at each node, and uses standard interfaces, such as AXI or Packet interfaces, or even uses the user's own interfaces. In summary, the NOC carries multiple types of traffic simultaneously.

For example, the user instantiates 256-bit NAPs in their design to gain access to the iNOC 120. Assuming the user's design is able to meet a frequency of 600 MHz, a single NAP provides 153.6 Gbps of read throughput, and 153.6 Gbps of write throughput.

Figure 2:
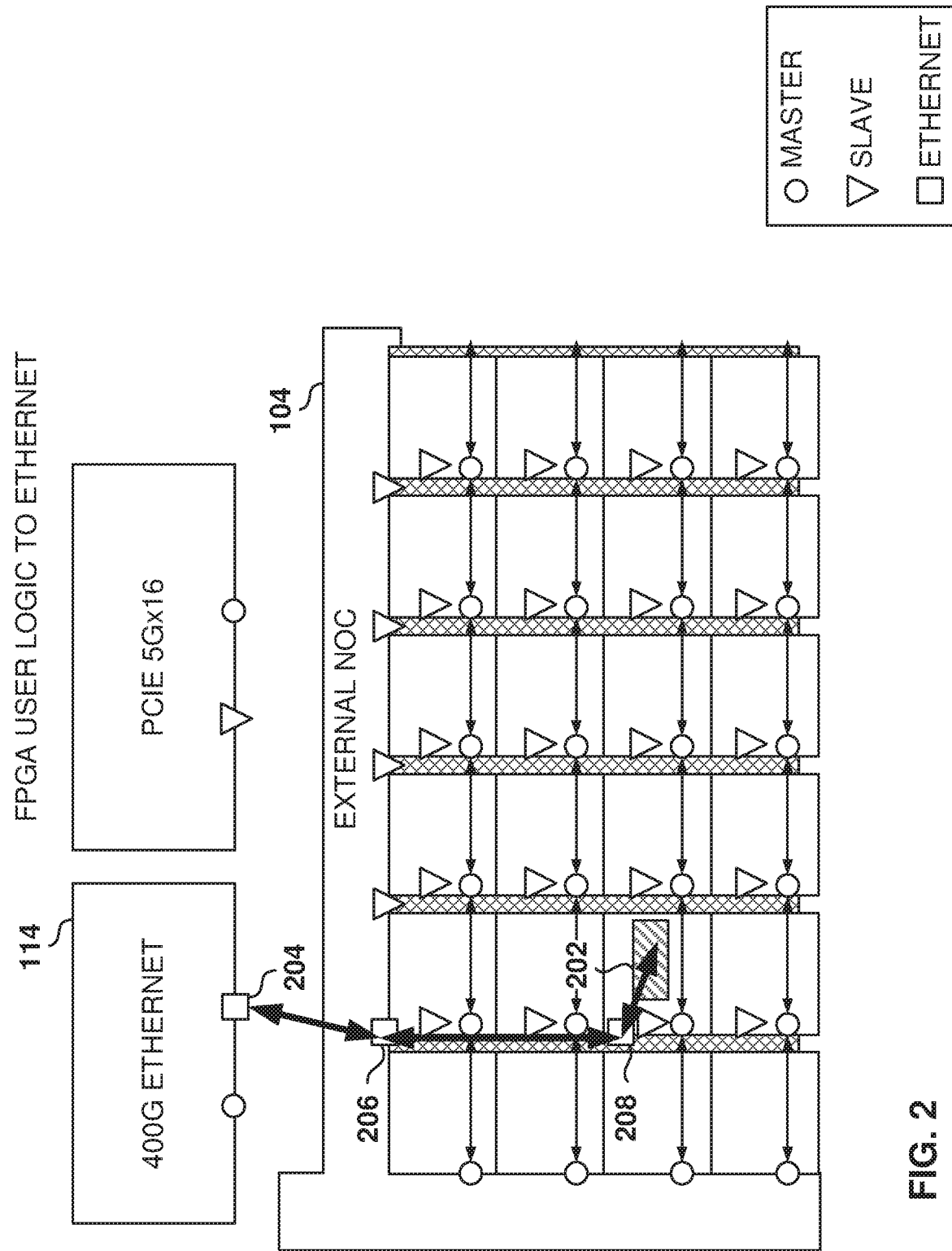
FIG. 2 illustrates an Ethernet connection to user logic, according to some example embodiments.

FIG. 2 illustrates an Ethernet connection to user logic, according to some example embodiments. In some example embodiments, the Ethernet controller 114 supports up to 400 Gbps of throughput, although other speeds may be supported, such as 200G and 100G.

In some example embodiments, the Ethernet controller 114 is connected directly to one or more columns of the iNOC 120, which allows the Ethernet controller 114 to issue packets directly to one of the iNOC columns without having to travel through the eNOC 104. In other example embodiments, the Ethernet packets may be transferred through the eNOC 104 and may be transferred to any column.

In the example illustrated in FIG. 2, an Ethernet packet is sent from interface 204 to the router 206 on top of the iNOC column, where the router 206 supports the transfer of Ethernet packets. The iNOC column carries the packet to the correct row, where it is delivered to the router 208 that is configured for packet transport. The router 208 then transfers the packet to the user logic 202 via the local NAP. The reverse data transfer follows the same path in the reverse direction.

In some example embodiments, for Ethernet packet transfers, 288 bits are transferred in every flit. The 288-bit data carries data to a single router 208 as specified in the flit. To interface with user logic in Ethernet mode, the router 208 reuses AXI data signals along with 32-bit additional signals. The Ethernet data is presented to the user logic on the same 288-bit interface used by CXS and raw-data transport. Further, the Ethernet packet may be encapsulated with additional information in the flit.

In some example embodiments, the NAP is able to translate the Ethernet format and protocol to AXI format and protocol. For example, the NAP may receive Ethernet packets, translate the data to AXI, and store the translated data in a memory location. This may be done by the NAP logic, or by logic in the FPGA adjacent to the NAP. Thus, the iNOC columns support the transport of multiple types of protocol, including Ethernet and AXI.

Figure 3:
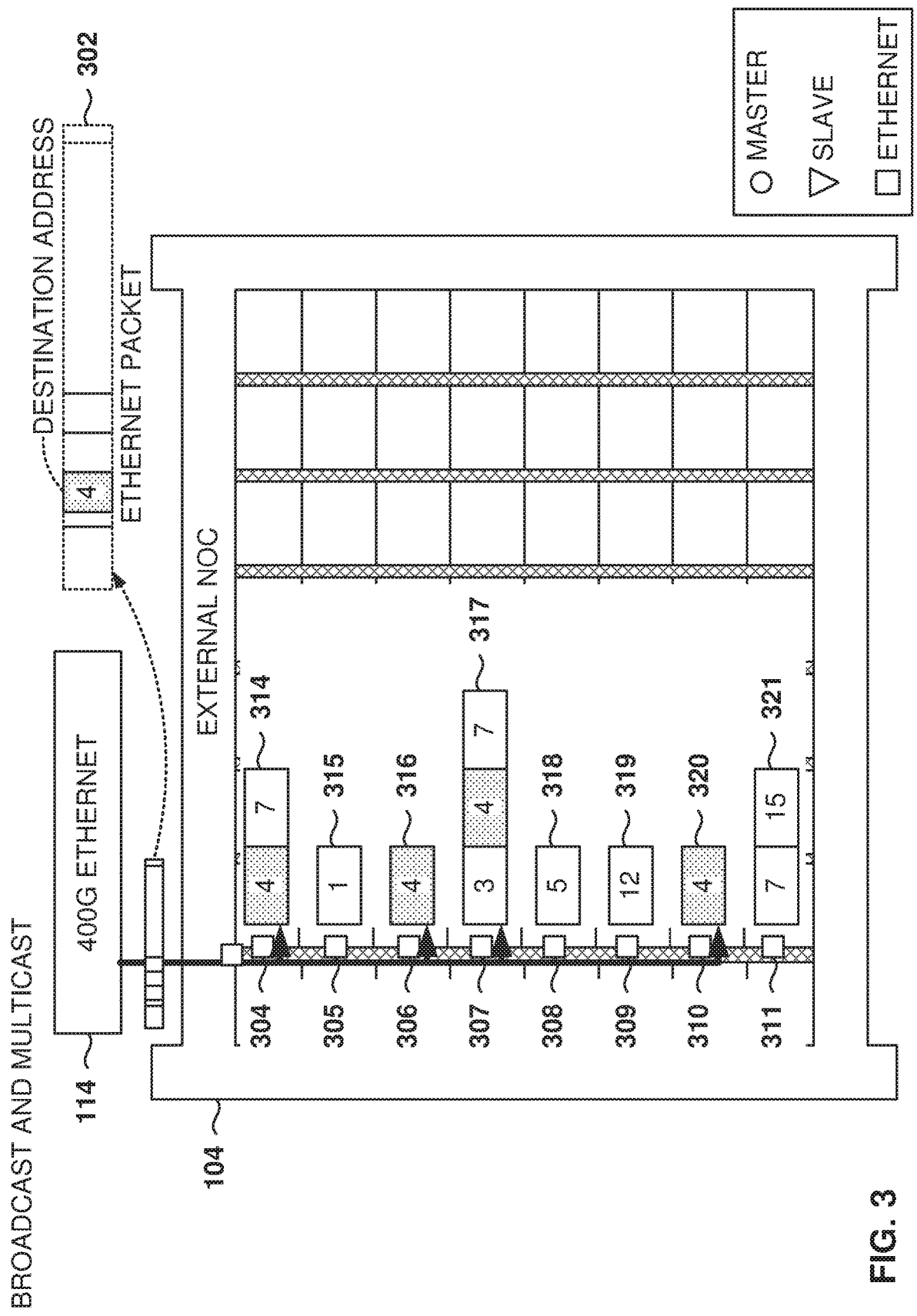
FIG. 3 illustrates broadcasting and multicasting within the internal network on chip (iNOC), according to some example embodiments.

FIG. 3 illustrates broadcasting and multicasting within the iNOC 120, according to some example embodiments. In addition to supporting transactions, the iNOC columns carry Ethernet data. In the Rx direction, each Ethernet Interface Unit (EIU) (part of the Ethernet subsystem) (e.g., 304-311) accepts one or more streams of Ethernet traffic from the Ethernet MACs. The EIU tags the Ethernet data with the correct destination ID, which determines the destination node, based on the device configuration (e.g., the user maps physical MACs to destination nodes in the column), interleaves the data with data from other MACs, and sends packets down the column. In the Tx direction, the EIU is the destination and in the Rx direction, the NAP is the destination.

In the Tx direction, the EIU having a local address equal to the destination field in the iNOC column flit captures the flit, copying it into its local buffer. The AXI encapsulation/decapsulation is bypassed, and the flit is presented to the Ethernet MAC as received. The start-of-packet, end-of-packet, and end-of-packet modulo indications, as well as other Ethernet control signals, are carried as part of the flit payload. For outbound Ethernet packets (from the user logic to Ethernet controller 114), the process is reversed: the user logic pushes data into the local EIU, which attaches the source ID and "North Terminal" destination ID at the top of the column and interleaves the data with other northbound flits. The source ID indicates which Ethernet MAC destination.

In some example embodiments, when the Ethernet controller 114 is operating at 400 Gbps, the Ethernet controller 114 presents to the EIU a 324 bit-wide interface running at approximately 800 MHz. By delivering the data in either a quad-segmented interface, or as a packet steamed over time, this amount of data fits within the throughput envelope of a single iNOC column. This amount of data, however, is more than a single iNOC NAP can present to the FPGA logic. To support 400 Gbps, multi-NAP data presentation is used. For example, four NAPs work in unison, each presenting/receiving 256 bits of data, to give the customer a combined data path of 1024 bits running at approximately 500 MHz. In another example embodiment, four Ethernet frames are buffered separately and sent separately to separate NAPs, where each is streamed in a 256-bit data path at approximately 500 MHz.

In some example embodiments, to support multi-NAP data presentation, the EIU takes the 324-bit interface from the 400 Gbps MAC core and splits it into four parallel streams of 256 bits each. Each of these streams is transferred into the 2 GHz domain, has a unique destination ID attached, and is interleaved with the others to be sent down the column, where they are picked up by their respective NAPs. In other embodiments, to support a slower fabric speed, the Ethernet packets presented in this way are quad segmented, such that any of the destination/source NAPs 304-311 gets the beginning, middle, or end of each packet. This mode is referred to as QSI mode, which adds complexity to the FPGA logic but allows lower latency transfer to the destination.

When the Ethernet controller 114 is operating at 200 Gbps, the Ethernet controller 114 presents a 324-bit wide interface running at approximately 400 MHz (alternatively, running at approximately 800 MHz where more than half the cycles are idle). When converted to a QSI interface, this amount of data fits within the throughput envelope of a single iNOC column. This amount of data, however, is more than a single NAP can present to the FPGA logic. Depending on the configuration, the 200 Gbps stream is presented as QSI to four NAPs, or as a packet streaming interface to four NAPs or two NAPs.

For Ethernet operating at 50 Gbps and less, the Ethernet controller 114 presents a 256-bit interface to the EIU. The EIU crosses this data into the 2 GHz iNOC clock domain and enters a small switching network to be sent to one of the two destination columns. Additionally, there is also one 50G interface per Quad MAC that buffers up packets.

As in other networks, communications in the NOC use addresses to identify nodes in the network. Thus, the different nodes of the NOC (e.g., Ethernet. PCIe, DDR, NAP) are assigned addresses, and the NOC is responsible for address decoding to determine where a request goes and to get the request to the correct location.

In some example embodiments, each router includes an address translation table that allows the base address, also referred to as the local address, of each endpoint (router/NAP or IP core) to be independent of its physical location. Thus, when the router receives a packet having as destination address one of the local addresses of the router, the router delivers the packet (or flit) to the local NAP.

The address translation table translates destination addresses to physical addresses of elements in the NOC. While the physical addresses are unique, the same local destination address may be mapped to more than one destination node (e.g., NAP). Thus, the address space for the NOC is completely configurable because the address translation tables of the NAPs are also configurable.

The address translation table in each NAP allows the destination location of each node or IP core to be looked up as a function of the address with each transaction issue. The address translation table allows the memory map seen by each NAP to be independent of that seen by other NAPs. This allows, for example, one accelerator (user logic) to see its private memory at a given base address, and a different accelerator to see its memory at the same base address, while the system has actually allocated memory independently for each accelerator.

This address translation table is also used to provide security, such that if some portion of user logic coupled to a given NAP is not enabled to access some other NAP, an IP core, the FCU, or some other address space, the disabled portion of the address space will be marked inaccessible in the address translation table for that given NAP.

The flexibility of configurable address translation tables enables the implementation of multicast and broadcast addressing schemes because each NAP supports multiple local addresses simultaneously. Broadcast in a column, for example, may be implemented by assigning the same local address to each NAP in the column as one of the NAP addresses, such that if a flit arrives with the broadcast address to the NAP, the NAP will deliver the flit locally.

In prior FPGA broadcast implementations, the broadcast packet had to be sent separately to each of the recipients of the broadcast, which would mean two or more packets being sent, instead of just one.

Similarly, a broadcast address may be assigned to all the NAPs at the top of the columns that are connected to the eNOC 104. The packages may then be broadcasted throughout all the columns. Further, broadcast may be implemented across one row of the iNOC 120, or across multiple rows of the iNOC 120.

Multicast is like broadcast, but only a subset of the NAPs share a given local address. In the example illustrated in FIG. 3, multiple NAPs in the same column are assigned the same local address 4, that is NAPs 304, 306, 307, and 310. It is noted that the NAPs may have additional addresses that are different from other NAPs.

When a packet 302, with destination address 4, is sent down the iNOC column, the NAPs 304, 306, 307, and 310 will determine that the packet 302 is addressed to one of its local addresses and deliver the packet 302 to the local NAP. Thus, one packet is used to multicast to multiple nodes on the network.

It is noted that broadcast and multicast may be implemented for multiple transport mechanisms, such as Ethernet and AXI. Further, because the network address tables are reconfigurable, as described above, broadcast and multicast addresses may be added, modified, or deleted while the FPGA is operating.

One use example is in applications related to machine learning. In machine learning, matrix multiplication is used frequently, and weights are used to identify optimized functions for the training and inference used in machine learning. The weights used for matrix multiplication may be used in multiple user logic areas; therefore, using multicasting is a good way of transmitting weight parameters to multiple user logic areas.

Figure 4:
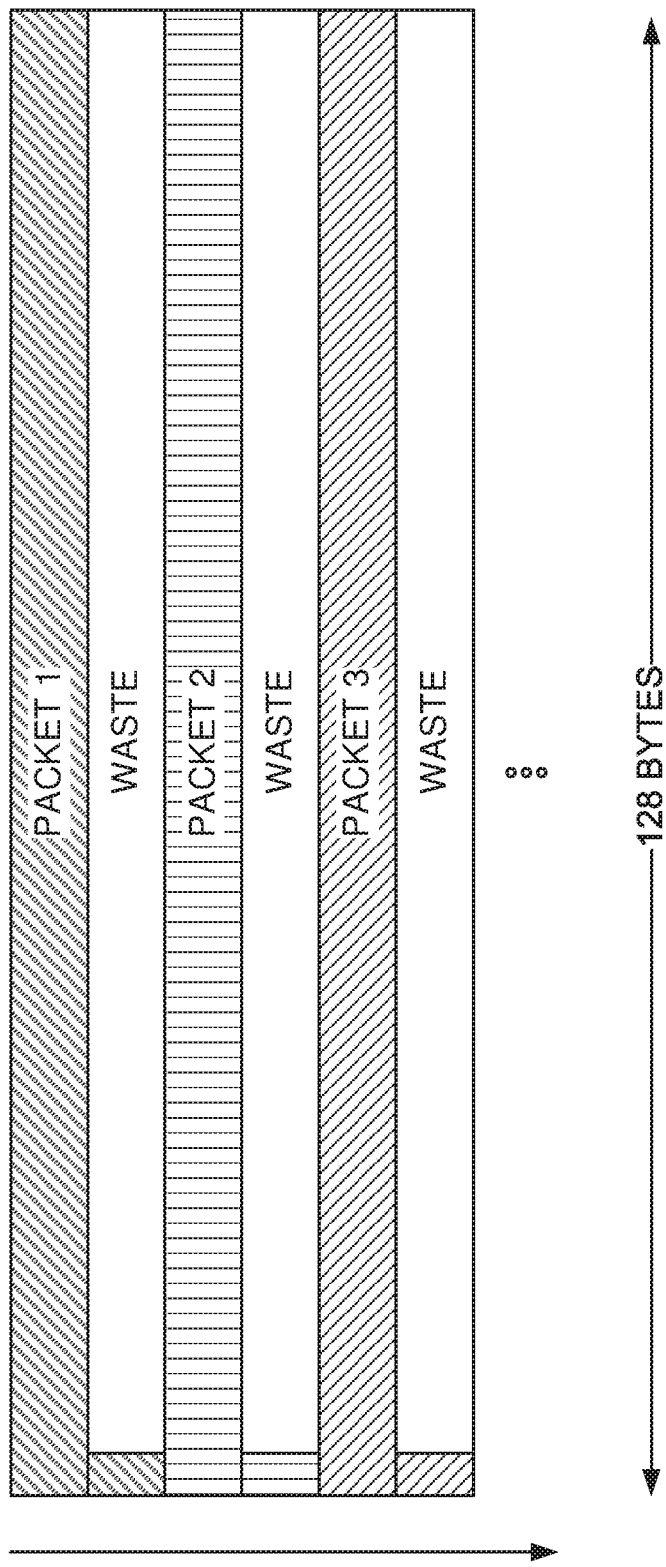
FIG. 4 illustrates the problem of wasted bandwidth when Ethernet packets are not a multiple of the network on chip (NOC) data transfer size, according to some example embodiments.

FIG. 4 illustrates the problem of wasted bandwidth when Ethernet packets are not a multiple of the network on chip (NOC) data transfer size, according to some example embodiments. When Ethernet packets are delivered on a wide interface, the beginning of the Ethernet packet is typically aligned with the bus datapath. Otherwise, the packet-handling logic becomes more complex to enable analyzing the packet (e.g., parsing) at any location.

For example, if the FPGA has a 128-byte (1024 bits) wide interface, the beginning of the Ethernet packet is lined up with the 128-byte interface to send the Ethernet packets in 1024-bit pieces.

However, if the Ethernet packet does not have a size that is a multiple of 128 bites, there will be waste, as the next packet will start being transmitted at the next cycle.

In the illustrated example, three packets are transmitted. In the worst case, the Ethernet packets are 129 bytes long, which means one 128-byte NOC packet (also referred to herein as a segment) is sent followed by a second NOC segment with only one byte. The remainder 127 bytes in the second segment are wasted.

This means that, in this worst-case scenario, almost half the bandwidth on the NOC is wasted. In order to accommodate for the wasted bandwidth, the FPGA needs to operate at a higher frequency (e.g., 732 MHz), almost double the frequency of an ideal scenario without waste.

Figure 5:
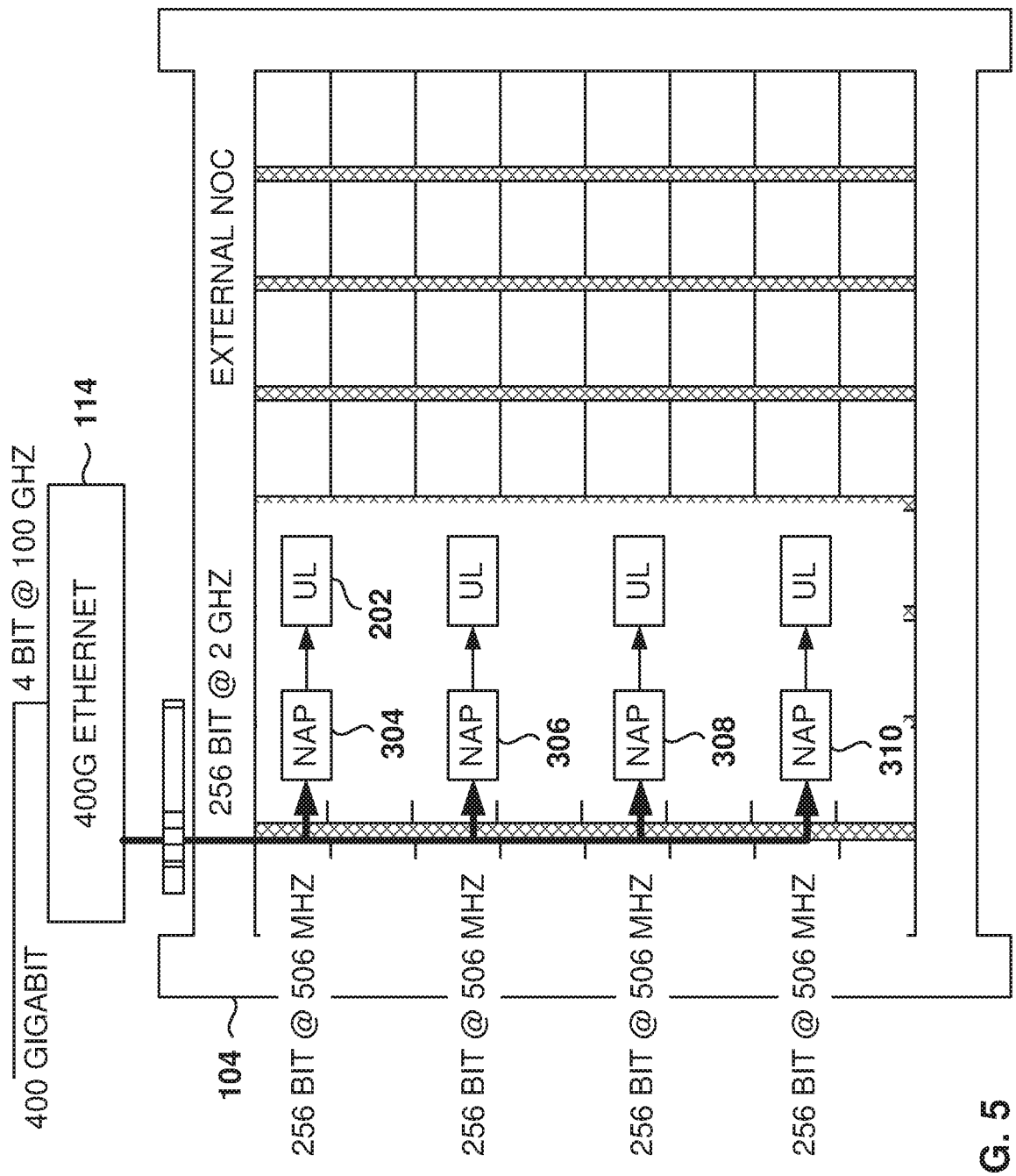
FIG. 5 illustrates the processing of one Ethernet packet at multiple network access points (NAPs), according to some example embodiments.

FIG. 5 illustrates the processing of one Ethernet packet at multiple network access points (NAPs), according to some example embodiments. In QSI mode in the inbound direction, Ethernet controller 114 receives the incoming data in a path of a certain width and at a certain frequency and rearranges the incoming data to a different data-path width and a different frequency for transmission to the iNOC column.

In the illustrated example, the Ethernet data is delivered to four NAPS, such as NAPs 304, 306, 308, and 310. This data delivered to each NAP is referred to as a segment or an iNOC packet, to differentiate from incoming Ethernet packets delivered at the Ethernet controller 114. The Ethernet packets are broken into segments and sent directly via the iNOC column, bypassing the eNOC, to the NAPS 304, 306, 308, and 310. The NAP 304 then passes the segment to the user logic 202 which will process the segment.

Since the Ethernet packet is being sent to four different NAPs, the user logic 202 in the different NAPs has to coordinate the processing of the Ethernet packet, because pieces of the Ethernet packet end up in four different places. Each NAP provides a small FIFO buffering and clock-domain crossing because the iNOC 120 runs at 2 GHz and the fabric runs slower, such as at 500 MHz.

It is noted that the 400G Ethernet traffic (e.g., 4-bit wide at 100 GHz) can be delivered in one column of the iNOC 120 that is running at 2 GHz. It is noted that the values of the frequencies are approximate values and other similar values may be used.

In order to make it easier to process packets when changing clock speeds, the packets are aligned on the segment boundaries, as described above with reference to FIG. 4. Otherwise, the user logic 202 would have to be much more complicated to be able to handle the beginning of Ethernet packets at any location within a NOC packet.

In some example embodiments, a hardwired signal SOP (start of packet) is provided to the NAPs (separate from the iNOC bus) in order to identify the segment carrying the beginning of the Ethernet packet.

Figure 6:
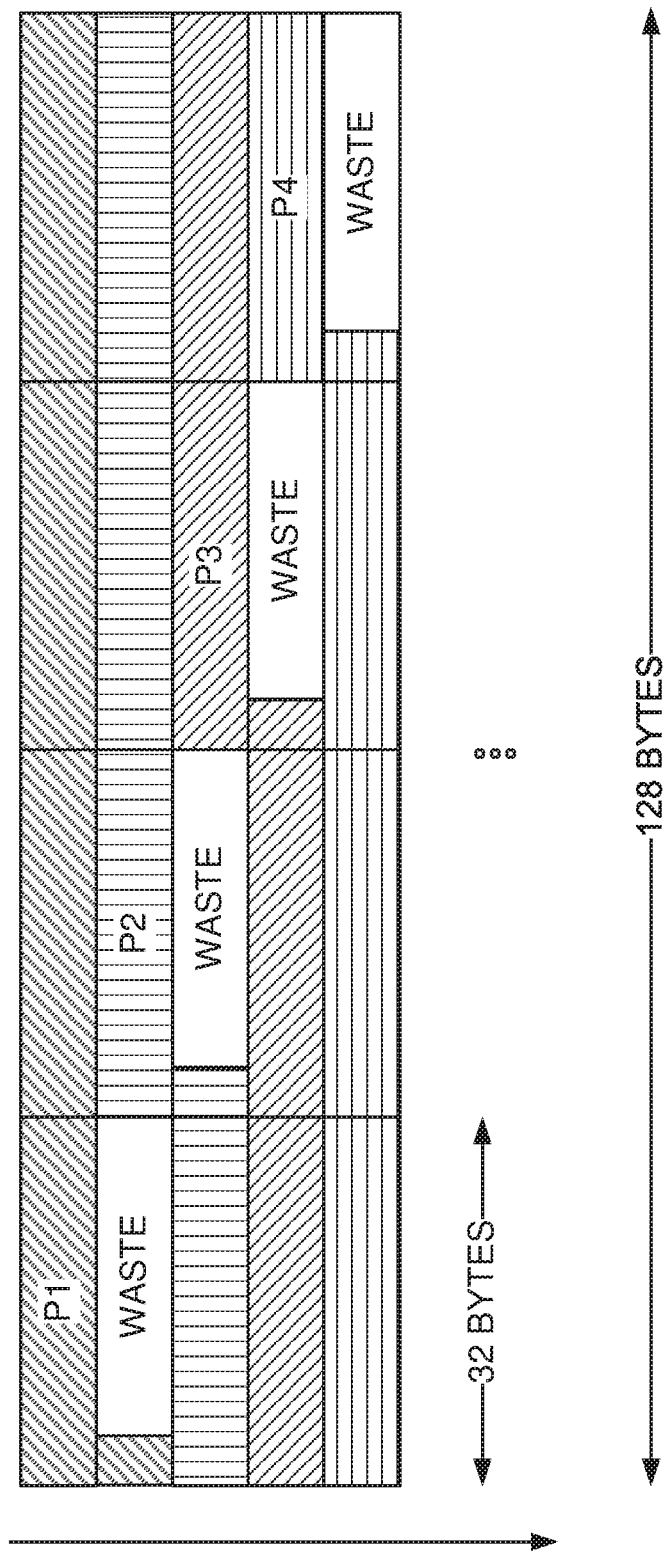
FIG. 6 illustrates how to reduce wasted network bandwidth by transferring multiple smaller segments per clock cycle, according to some example embodiments.

FIG. 6 illustrates how to reduce wasted network bandwidth by transferring multiple smaller segments per clock cycle, according to some example embodiments. In order to reduce the waste illustrated in FIG. 4, the portions of the Ethernet packet for each cycle are divided into four segments and each of the segments is delivered to one of the NAPs in the same column, as shown in FIG. 5.

In QSI mode, the Ethernet packet can be aligned with any of the four segments, so the user logic is configured to handle the beginning of the Ethernet packet at any of the four NAPs. Thus, the user core logic for handling Ethernet packets becomes more complex, but the throughput overall is improved.

It is noted that the embodiments illustrated in FIG. 6 are examples and do not describe every possible embodiment. Other embodiments may utilize a different number of segments, such as 2, 3, 5, 8, 16, etc. The embodiments illustrated in FIG. 6 should therefore not be interpreted to be exclusive or limiting, but rather illustrative.

In the example illustrated in FIG. 6, there could still be waste in one of the segments because the Ethernet packets do not have to necessarily be a multiple of the segment size. However, the maximum amount of waste has been reduced from 127 bytes to 31 bytes (only one byte of data in the segment and 31 bytes of waste). Because there is less waste in QSI mode, the clock at the core can run slower, such as at 500 MHz instead of 700 MHz.

Returning to FIG. 5, processing of the Ethernet packet often is done by a parser that examines the Ethernet header and determines processing, such as sending it to memory for later retrieval, handing to a TCP/IP engine, sending to a video streamer handler, sending to a decryption engine, etc.

However, since in QSI mode the beginning of the Ethernet packet can arrive at any of the four NAPs, this means that four different parsers are required in the user logic 202. Thus, the network utilization has improved, but the handler logic has increased. Further, by distributing the processing of Ethernet pockets to multiple points, there is also relief in congestion because not all the packets have to go to the same parser.

On the outbound direction, the opposite distribution of segments takes place, that is, four NAPs coordinate to send an Ethernet packet out of the FPGA. The NAPs for the outbound direction can be the same NAPs as the one for the inbound direction or can be different NAPs in the same iNOC column or in a different iNOC column. If different NAPs are used for the inbound and outbound directions, congestion is further reduced because of the separate data paths.

Figure 7:
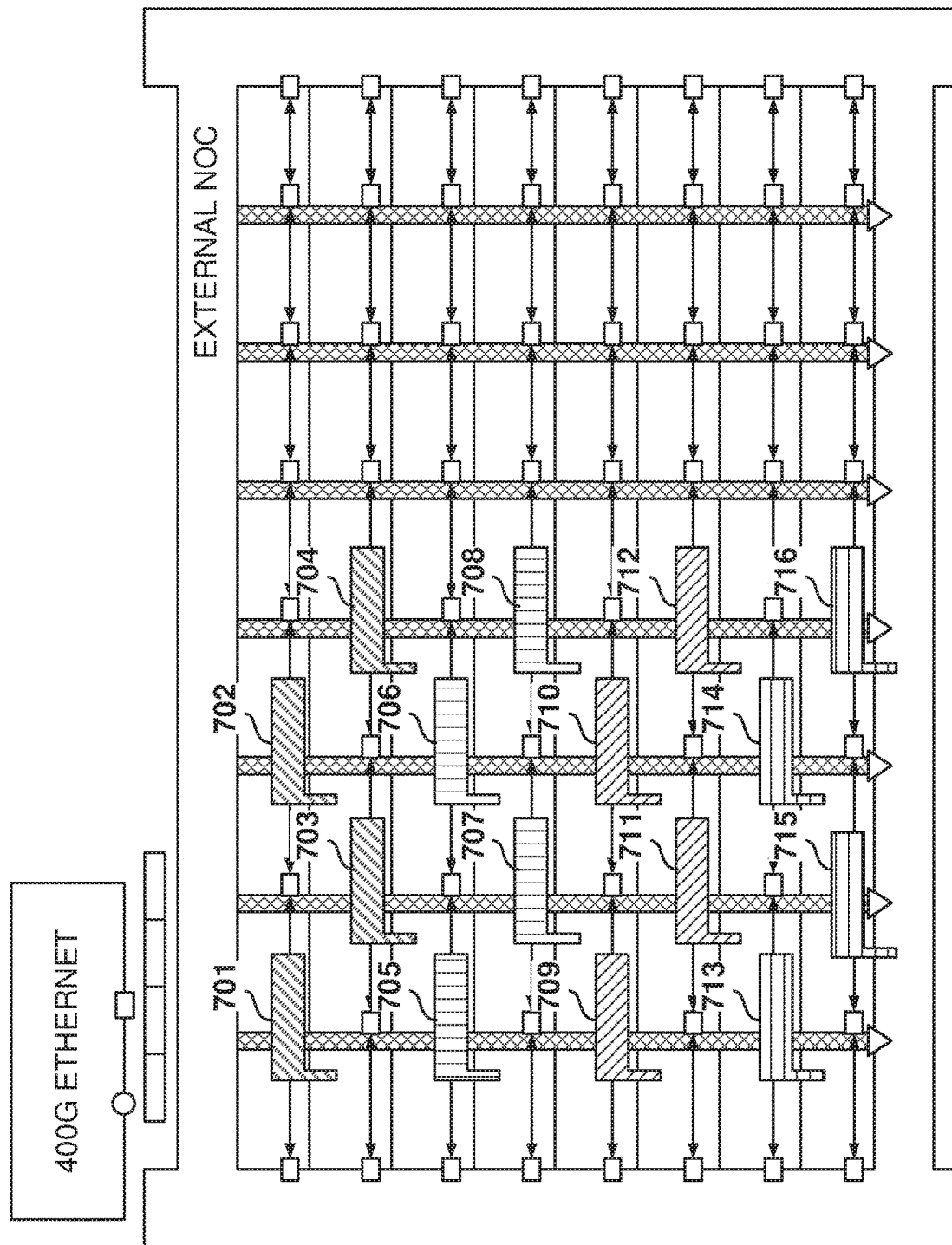
FIG. 7 illustrates the distribution of packets to multiple NAPs, according to some example embodiments.

FIG. 7 illustrates the distribution of NOC packets to multiple NAPs, according to some example embodiments. In some example embodiments, the NAPs that receive one Ethernet packet can be situated in different iNOC columns, or any combination thereof. For example, two NAPs can be in one iNOC column and two other NAPs can be in a second column, two NAPs can be in one iNOC column and the other two NAPs in two other columns, one NAP can be in one column and the other three NAPS in a second column, etc.

The designer of the FPGA has the flexibility to determine how to handle the Ethernet packets and structure the logic to efficiently process the Ethernet packets based on the application that the FPGA is being used for.

In the example illustrated in FIG. 7, each Ethernet packet is sent to NAPs in four different columns: the first Ethernet packet is sent to NAPs 701-704, the second Ethernet packet is sent to NAPs 705-708, the third Ethernet packet is sent to NAPs 709-712, and the fourth Ethernet packet is sent to NAPs 713-716. By distributing the handling of Ethernet packets, the potential bandwidth for handling Ethernet packets is increased while keeping the operating clock of the FPGA low.

Figure 8:
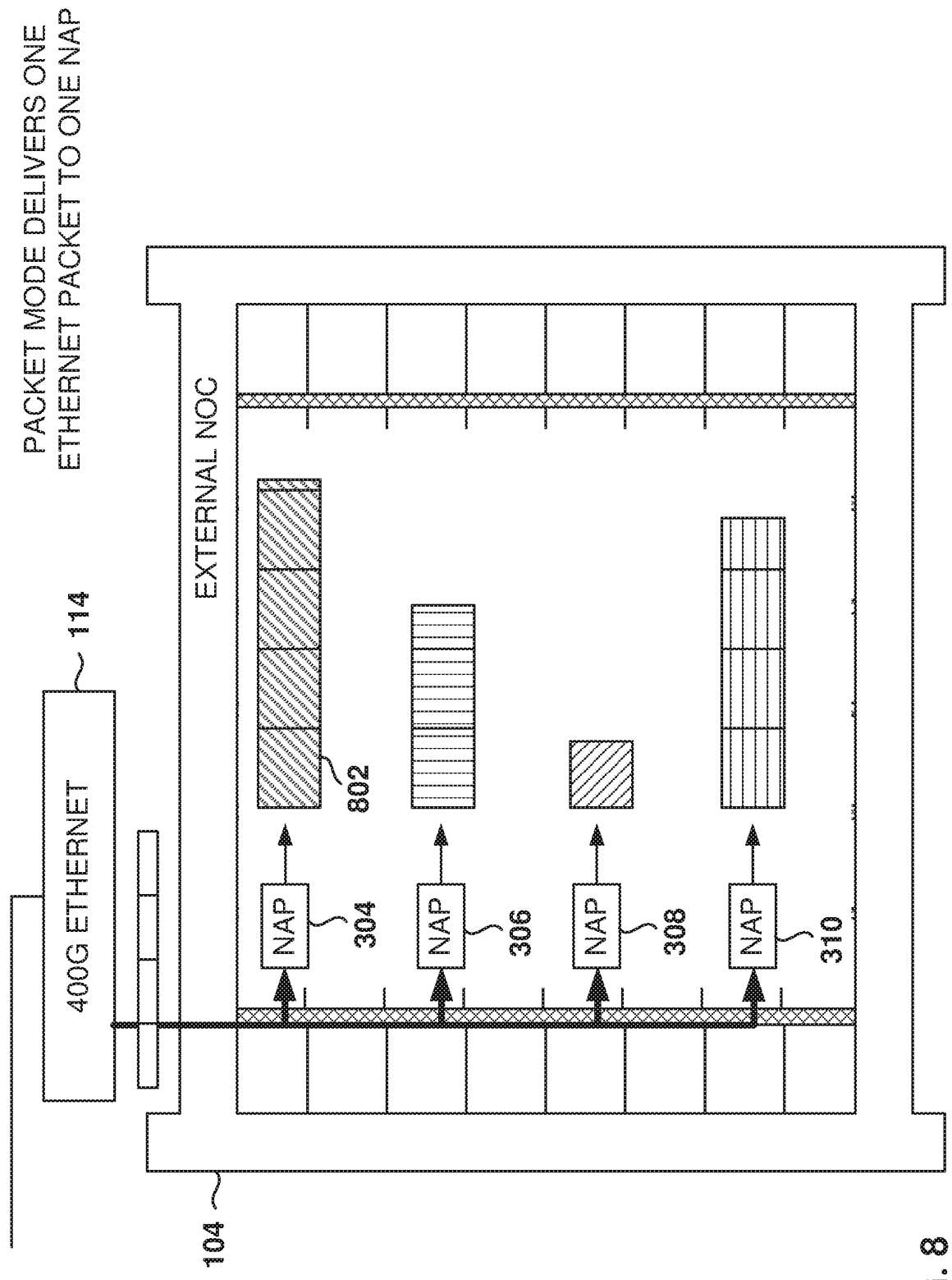
FIG. 8 illustrates the processing of Ethernet packets when the Ethernet subsystem operates in packet mode, according to some example embodiments.

FIG. 8 illustrates the processing of Ethernet packets when the Ethernet subsystem operates in packet mode, according to some example embodiments. The Ethernet controller 114 can be configured to send Ethernet packets in what is referred to as "packet mode." In packet mode, the Ethernet packets are still segmented as in QSI mode, but all the segments of one Ethernet packet are delivered to the same NAP.

In the illustrated example, a complete Ethernet packet 802 is delivered to NAP 304, and other Ethernet packets are similarly delivered to other NAPs 306, 308, and 310.

In this example, the Ethernet packet 802 includes five segments that are sent in different cycles, which may be consecutive or not. The Ethernet controller 114 buffers the segments and can combine segments to different NAPs to be sent during the same cycle through the iNOC column. For example, during one cycle, the Ethernet controller 114 sends four segments to respective NAPs 304, 306, 308, and 310. In the next cycle, the Ethernet controller 114 sends segments to NAPs 304, 306, and 310 because the Ethernet packet for NAP 308 fits within one segment, and so forth.

It is noted that other configurations may include fewer or more NAPs for handling Ethernet packets. For example, in one configuration, all Ethernet packets are sent to NAP 304.

Since a complete Ethernet packet is delivered to one NAP, the packet handling is simplified. For example, if all incoming traffic is sent to NAP 304, then only one Ethernet parser is required in the user logic to determine where to send the Ethernet packets for processing.

Further, it is noted that the beginning of Ethernet packets does not have to be aligned to be sent via one iNOC column. For example, in a given cycle, the Ethernet controller 114 may be sending the first segment of one packet to one NAP, the third segment of another packet to another NAP, etc.

Another benefit of packet mode is that, because the user logic receives the whole packet, the user logic does not have to coordinate with other cores that receive other segments of the Ethernet packet. For example, if two NAPs are configured for receiving Ethernet packets, each NAP may have its own parser that is independent from the other parser, making packet handling much easier. Further, each NAP can be associated with the same TCP/IP engine or with a different TCP/IP engine; that is, each parser could forward the packet to the same TCP/IP engine or there could be separate and independent TCP/IP engines.

In QSI mode, segments are sent in the order in which they are received so the segments (and the Ethernet packets) are delivered in the order in which they arrived. However, in packet mode there is buffering in the EIU 114. Some packets may be small and some packets might be large, and because of the buffering, this may cause that the Ethernet packets to be delivered to the NAP out of order (e.g., a small Ethernet packet may arrive ahead of a previously received large Ethernet packet).

To handle Ethernet packets delivered out of order, a sequence number is added to each Ethernet packet. This way, the user logic can process the Ethernet packets in the right order based on the sequence number.

Figure 9:
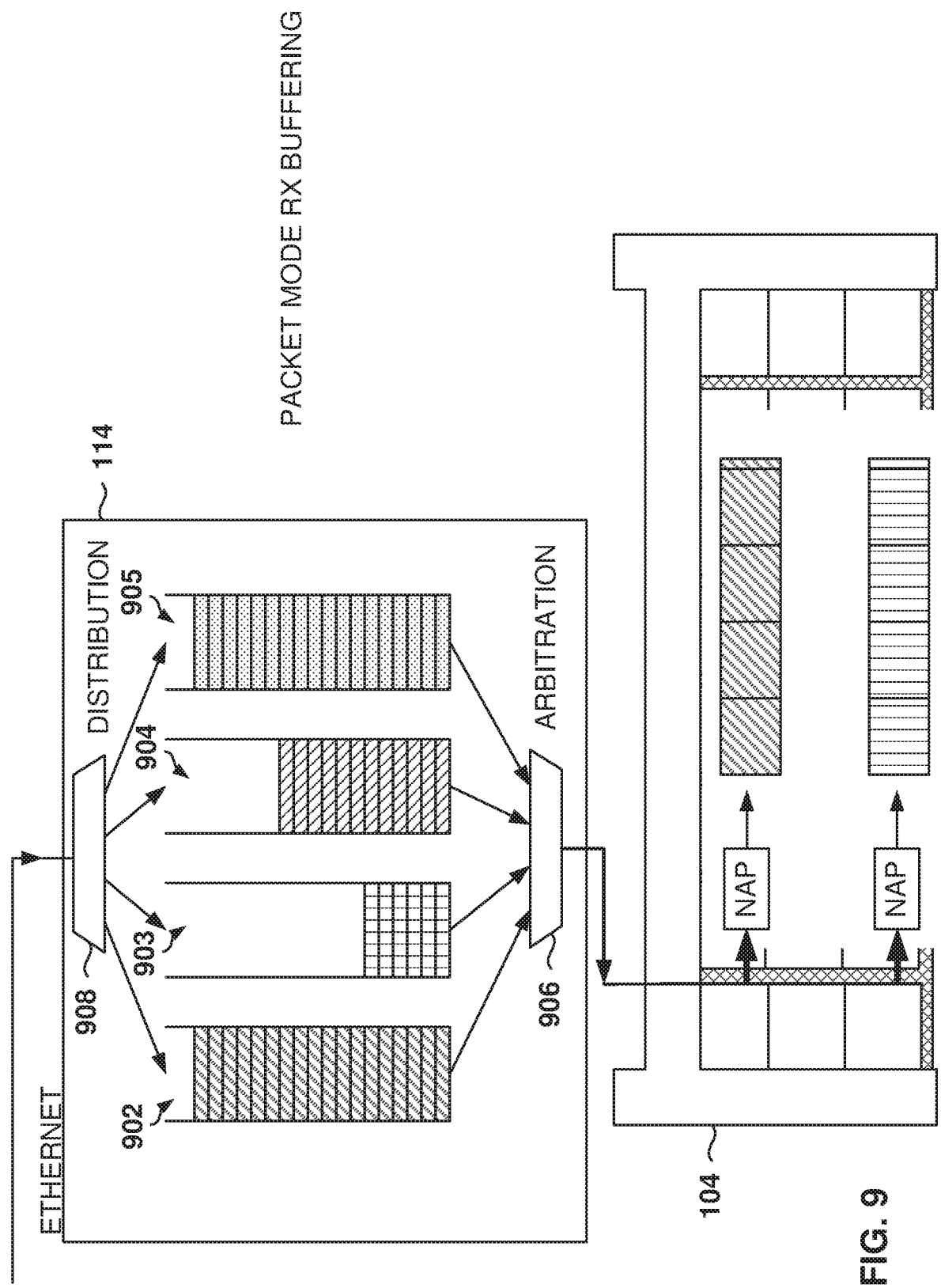
FIG. 9 shows the buffering of Ethernet packets for packet mode, according to some example embodiments.

FIG. 9 shows the buffering of Ethernet packets for packet mode, according to some example embodiments. The maximum size of a standard Ethernet packet is 1522 bytes, but some new data-center implementations support large sizes, such as 9000 bytes. Therefore, the FPGA is able to handle these large Ethernet packets. Thus, the FPGA Ethernet controller 114 can handle efficiently not only the small Ethernet packets, but also the large Ethernet packets.

As discussed above, in some implementations, the Ethernet packets arrive using a bandwidth four times of a single NAP, which is why the pieces of the Ethernet packet are sent to four different NAPs. However, Ethernet traffic often alternates small, medium, and large Ethernet packets. The buffering can handle all packet sizes without affecting the traffic throughput, such as by avoiding bottlenecks or deadlock.

The Ethernet controller 114 includes four buffers 902-905, which are associated with respective NAPs in the inbound operation of packet mode. When an Ethernet packet arrives to the Ethernet controller 114, the Ethernet controller 114 determines the destination NAP for the packet and distributes 908 the Ethernet packet to the corresponding buffer.

The Ethernet controller 114 arbitrates 906 the transmittal of the segments in the buffers 902-905 to the NAPs. For example, in one cycle, one segment is selected from each buffer 902-905 and then transmitted in parallel to the four NAP destinations.

Figure 10:
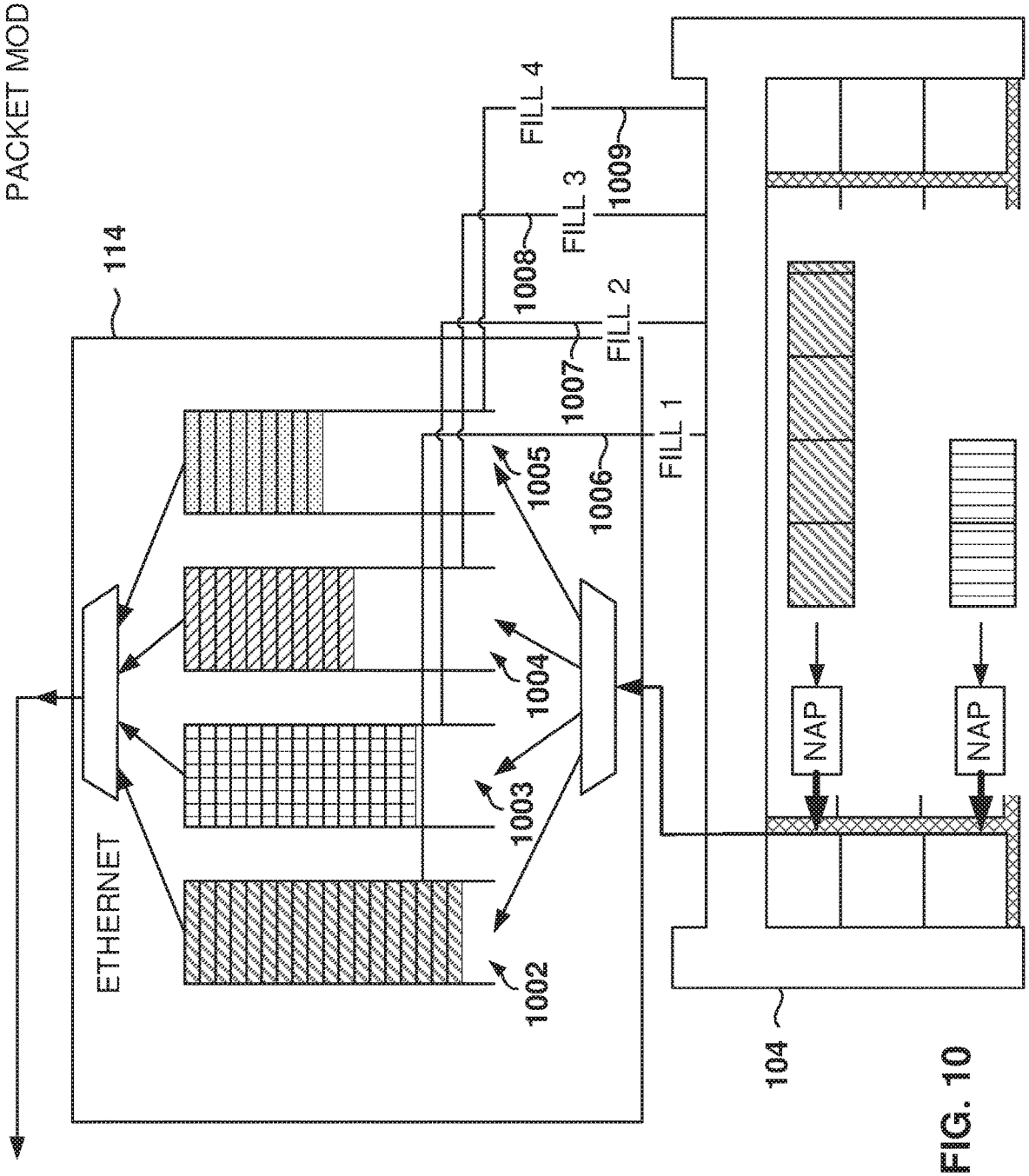
FIG. 10 shows the buffering of packets transmitted in the outbound direction, according to some example embodiments.

FIG. 10 shows the buffering of packets transmitted in the outbound direction, according to some example embodiments. On the outbound direction (e.g., transmit packet mode), buffers 1002-1005 are used to buffer the segments sent from the NAPs. The Ethernet controller 114 then forms the Ethernet packets for transmission to the outside of the FPGA.

One of the challenges of buffering is that the NAPs do not have much space for buffering before sending to the Ethernet controller 114; therefore, most of the buffering takes place at the Ethernet controller 114. However, large Ethernet packets may interfere with the transmittal of small Ethernet packets because the large packets require a large number of cycles. This phenomenon is referred to as head-of-line blocking.

If a stop signal were sent from the Ethernet controller 114 to the NAP, the segments in transit still need to make it to the Ethernet controller 114. Because of route-trip latency, 30-40 cycles worth of data may be required to be buffered in the outbound direction for each NAP. However, since there are up to 64 NAPs, the amount of buffering would not be practical for the FPGA core as too much buffering would be required.

In some example embodiments, fill-level signals 1006-1009 enable predictive flow control. A fill-level signal is available for each of the buffers 1002-1005, e.g., fill-level signals 1006-1009. The fill level signal is a hardware signal that is not sent through the iNOC, but as a separate signal that is made available to the FPGA core. The fill-level signal is set to a first value (e.g., a voltage value greater than 0, a logical value of 1) if the buffer is full to a predetermined level, and set to a second value (e.g., a voltage level of 0, a logical value of 0) if the buffer is not full to the predetermined level. For example, the predetermined level may be 75%, or a value in the range from 50% to 99%. The use of a voltage signal is useful because, in the presence of different clock domains, the logic does not have to address the different clock domains. For example, if a message were transmitted to indicate that the buffer has reached the threshold, the Ethernet controller 114 would have to establish a communication protocol with the NAP that would handle the different clock domains. This would take longer and use more resources.

In some example embodiments, the predetermined level is configurable by the developer, such that the developer may configure a threshold for the Ethernet controller 114 to set the fill-level signal to 1, e.g., 80% full.

This way, the NAP can check the corresponding fill-level signal, and when the field-level signal is activated, the NAP stops sending to the Ethernet controller 114 until the fill-level signal is deactivated. This allows segments in transit to arrive at the Ethernet controller 114 without finding a full buffer. This flow control guarantees that no Ethernet data is dropped.

Figure 11:
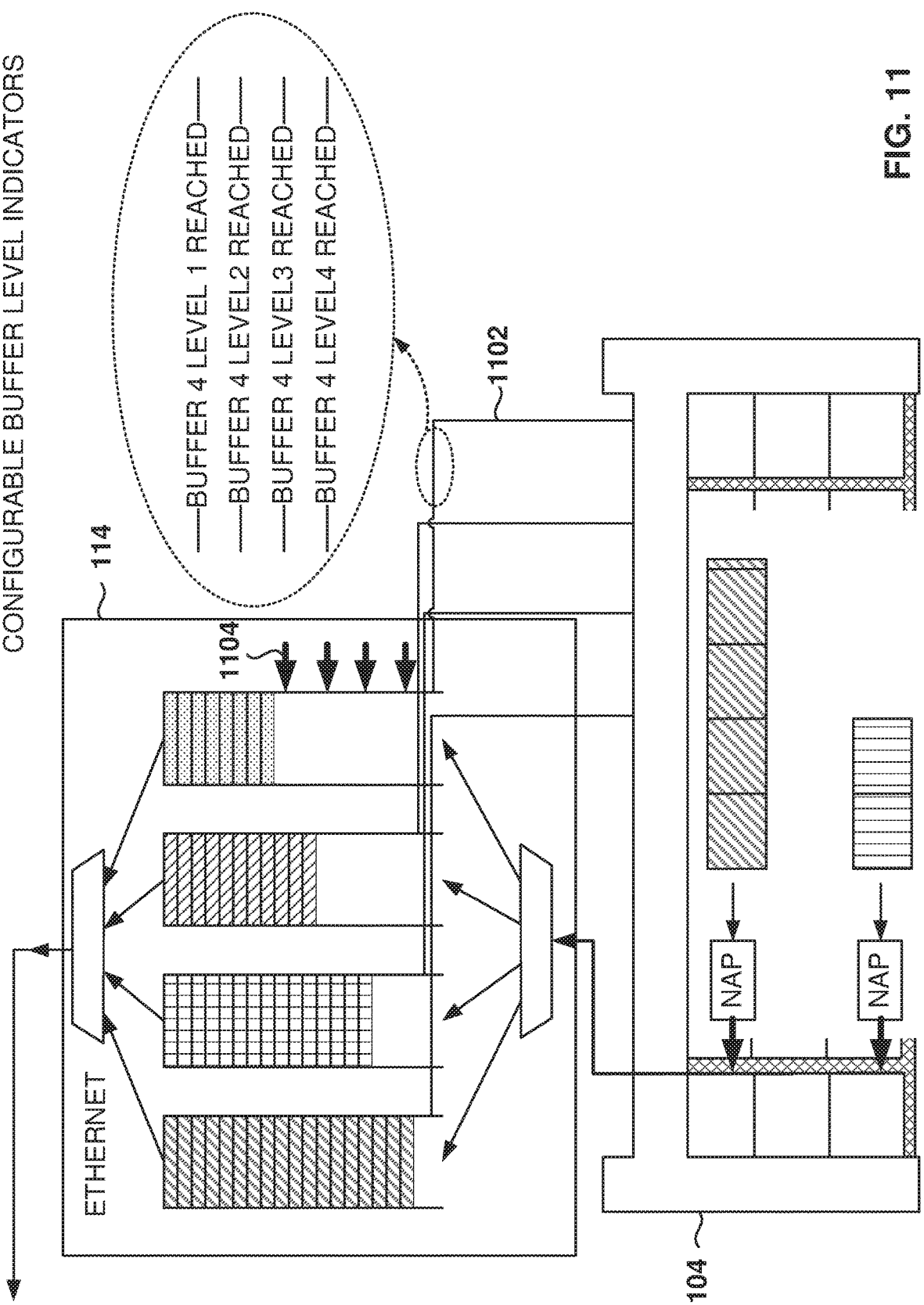
FIG. 11 illustrates the use of configurable buffer level indicators for the outbound buffers, according to some example embodiments.

FIG. 11 illustrates the use of configurable buffer level indicators for the outbound buffers, according to some example embodiments. In some example embodiments, instead of one fill level provided for each buffer, multiple signals may be provided for different fill levels. For example, in one embodiment, four different fill levels are provided (e.g., 50%, 66%, 90%, 95%).

Each of the fill-level signals is a hardwired signal provided to the FPGA core as described above. In some example embodiments, each of the fill-level thresholds is configurable by the designer in order to better handle traffic based on the applications (e.g., video streaming or file downloads). The fill levels are provided to the core and the user logic can read the values as needed.

Figure 12:
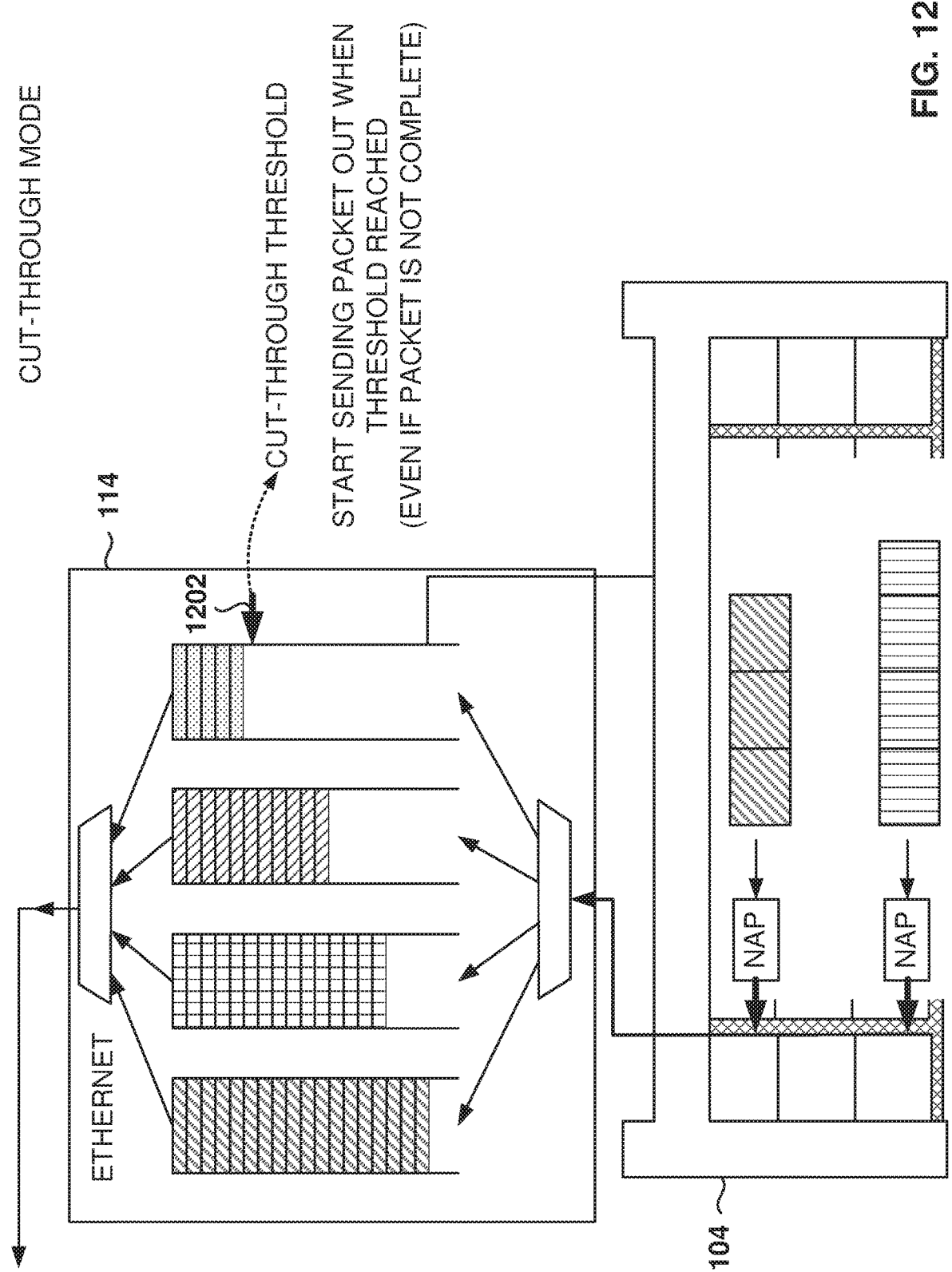
FIG. 12 illustrates the use of cut-through mode for forwarding packets before their complete arrival, according to some example embodiments.

FIG. 12 illustrates the use of cut-through mode for forwarding packets before their complete arrival, according to some example embodiments. Typically, network nodes use the store-and-forward mode where packets are stored in a buffer as they are received; when the complete packet has been received, then the packet is transmitted to the next network node.

However, the time to store and forward the packet increases the latency of the network, that is, how long it takes packets to go from source to destination.

In certain applications latency is critical, such as for streaming high frequency trading. To improve the latency in processing outbound Ethernet packets at the FPGA, a cut-through mode is provided where the Ethernet packet can start being transmitted outside of the Ethernet controller 114 before the complete packet has been received by the Ethernet controller 114 from the FPGA core.

A cut-through threshold is a percentage value associated with a fraction (e.g., 66%) of Ethernet packet already received by the Ethernet controller, such that once that percentage value is received, the Ethernet controller can start forwarding the Ethernet packet to the outside. It is assumed that the user believes that by the time the portion of the Ethernet packet not yet received has to be sent out, that portion will have already arrived to the Ethernet controller 114. Of course, the danger is that the data will not be available if there is a problem, but that is something for the user logic to control. The benefit is a reduction in latency, which is very valuable for certain streaming applications.

The cut-through threshold value is configurable per buffer, such that the user logic can impose different thresholds for different applications. As in the case of the fill-level signals, the cut-through signal is provided, in some example embodiments, as a hardwired signal with two different voltage levels: one for when the threshold has not been reached and one when the threshold has been reached (e.g., a positive voltage and ground, a negative voltage and ground, a positive voltage and a negative voltage).

Figure 13:
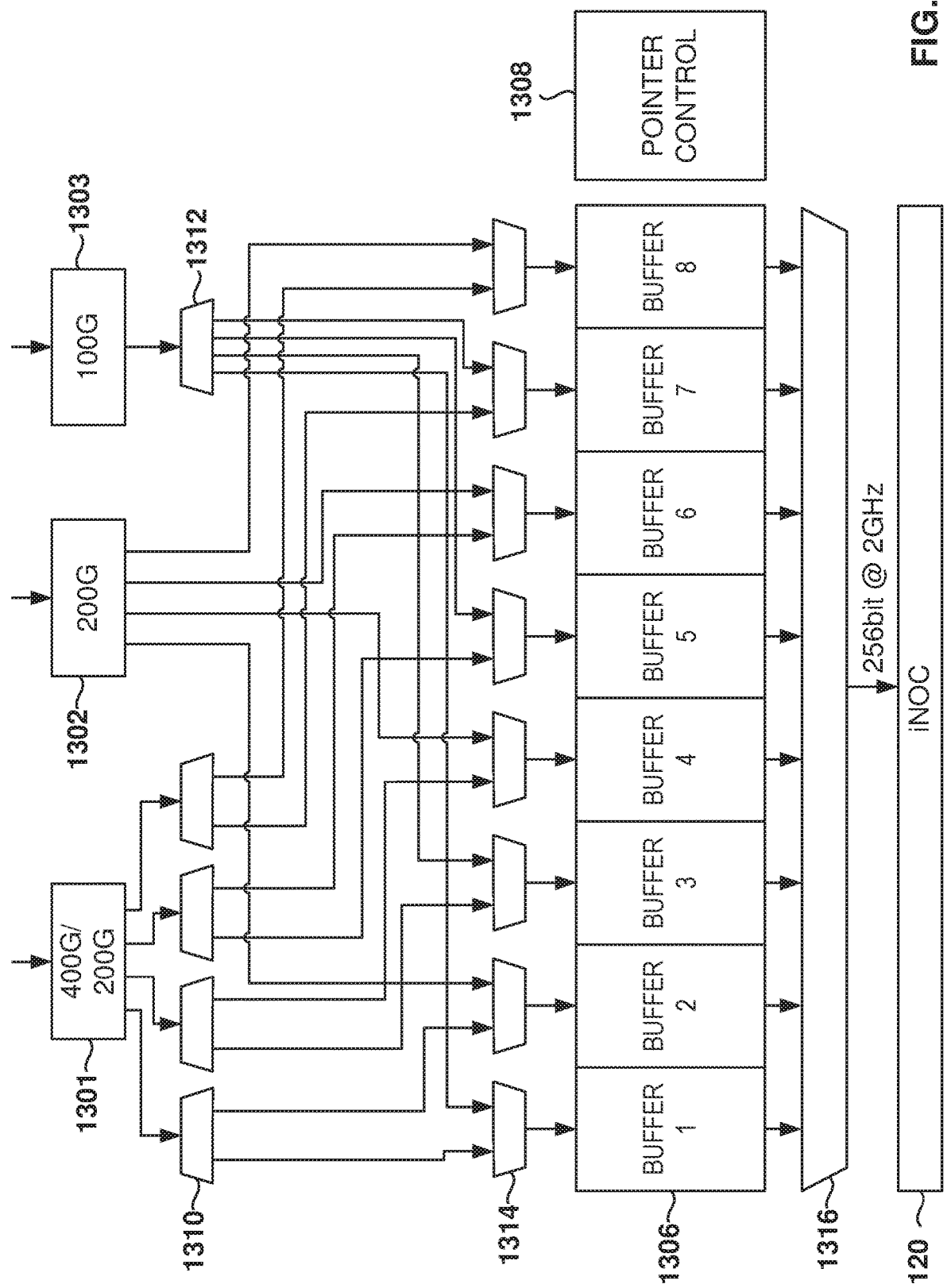
FIG. 13 is an architecture for supporting multiple Ethernet modes, according to some example embodiments.

FIG. 13 is an architecture for supporting multiple Ethernet modes, according to some example embodiments. The FPGA is configurable to support different Ethernet modes, such as 400G, 200G, and 100G. In some example embodiments, there are three Ethernet Media Access Controllers (MACs): Ethernet MAC 1301 that implements 400G or 200G, Ethernet MAC 1302 for 200G, and Ethernet MAC 1303 for 100G.

The buffers 1306 are shared by the different Ethernet MACs 1301-1303 in order to use less memory than if each of the Ethernet MACs had its own buffers. In one embodiment, 36 Kbytes of memory are reserved for the buffers 1306, but other values are also possible. It is noted that the buffering accommodates both the QSI and the packet modes. Therefore, the buffering scheme is very flexible because it can accommodate multiple Ethernet MACs in QSI and packet mode, which makes the FPGA very flexible regarding Ethernet packet handling.

Each of the Ethernet MACs 1301-1303 is connected to the buffers 1306 via configurable wiring depending on the operating mode. The configurable wiring is referred to herein as a switching network that includes demultiplexers 1310 and 1312 and multiplexers 1314 and 1316. Multiplexer 1316 connects to one or more iNOC columns. In one embodiment, the output of multiplexer 1316 is a stream 256-bit wide at 2 GHz. The Ethernet controller (e.g., 114) will select the data from one of the buffers 1306 by activating the corresponding input of multiplexer 1316 and sending the data from the buffer to the column in the iNOC 120.

Depending on the Ethernet operational mode, the connections on the switching network are turned on or off, as described in more detail below with reference to FIGS. 14-18.

In some example embodiments, there are five different Ethernet operating modes:
One 400G or 200G interface in QSI mode;
One 400G or 200G interface in packet mode;
Two 200G interfaces in QSI mode;
Two 200G interfaces in packet mode;
One 200G interface and one 100G interface, both in packet mode.

In some example embodiments, selection registers are used to configure the selected mode. For example, the modes identified above are configured in the selection registers with the respective values of 0, 1, 2, 3, and 4, but other values are also possible. Although embodiments are presented for the inbound direction, a similar structure is also provided for outgoing communications.

Pointer control 1308 includes a plurality of pointers to manage the buffers 1306 and the data stored in the buffers 1306. In one embodiment, the buffers are circular FIFO (first in, first out) buffers and include a head-of-queue pointer and a tail-of-queue pointer, also referred to as a read pointer and a write pointer. The pointer control 1308 operates differently based on the operating mode, as described below. For example, in some cases each buffer 1306 is divided in two sub-buffers, resulting in 16 actual buffers instead of eight. The memory structure of the buffers 1306 is the same, but the pointer control 1308 changes, such that each half buffer has its own pointers.

Figure 14:
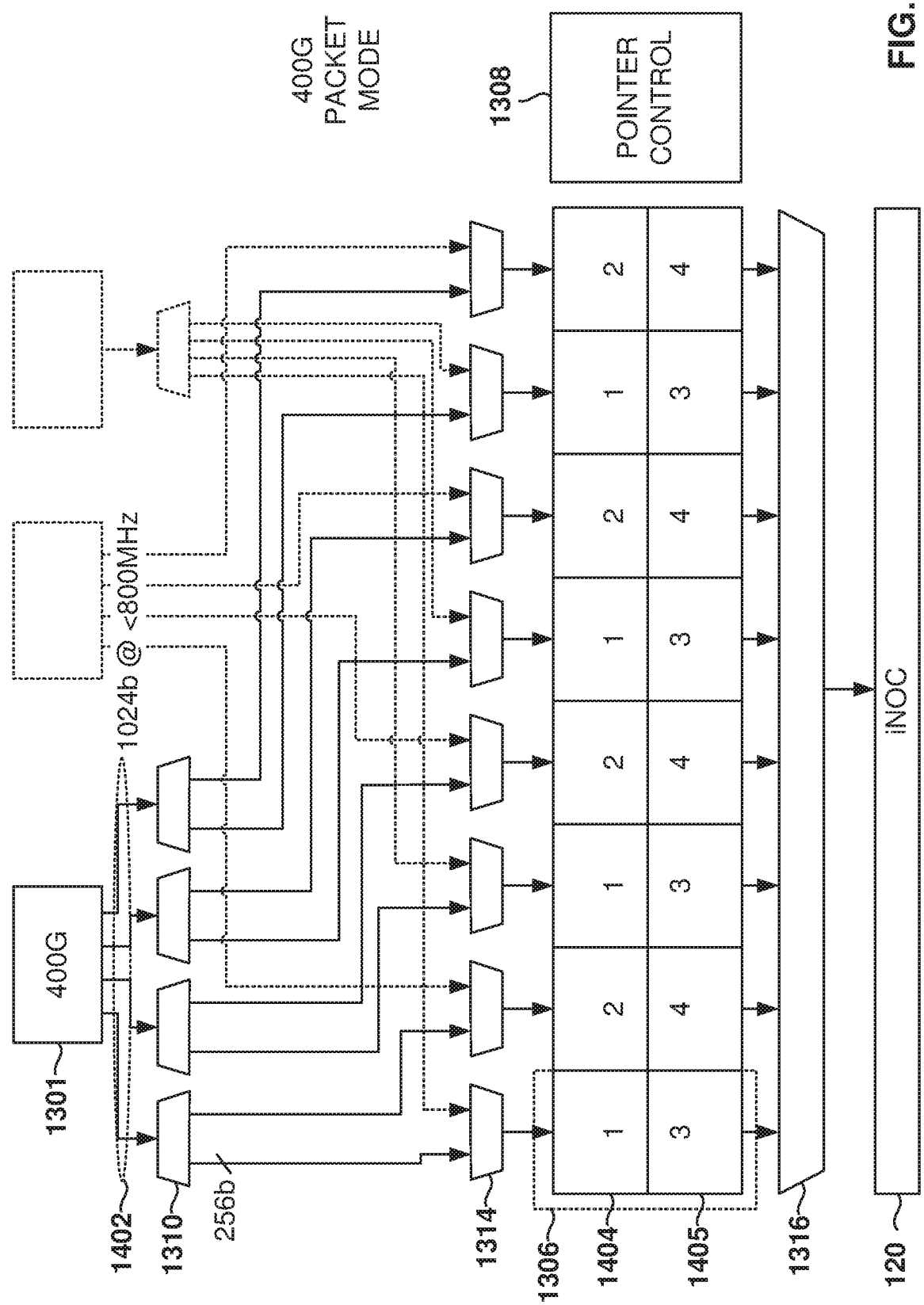
FIG. 14 illustrates the 400G Ethernet packet mode, according to some example embodiments.

FIG. 14 illustrates the 400G Ethernet packet mode, according to some example embodiments. It is noted that this configuration is also operable as a 200G interface instead of 400G. The 400G MAC 1301 provides a stream 1402 that is 1024-bit wide at up to 800 MHz. The 1024 bits are split into four 256-bit segments that are coupled to a respective demultiplexer 1310. For example, the four segments would include, respectively, bits 0 . . . 255, 256 . . . 511, 512 . . . 767, and 768 . . . 1023 of the 1024 bits from the Ethernet packet transmitted in parallel.

In this configuration, each 256-bit segment is directed by demultiplexer 1310 to one of the multiplexers 1314. The other inputs to multiplexer 1314 are not active (e.g., connected); therefore, the output of multiplexer 1314 is the same as the one active input.

In the 400G packet mode, each buffer 1306 is logically split into two buffers 1404 and 1405, also referred to herein as sub-buffers or half buffers. The pointer control 1308 has separate pointers for each of the sixteen buffers.

In packet mode, the data is interleaved such that each complete Ethernet packet goes to one of the NAPs. In FIG. 14, each buffer is associated with a NAP from 1 to 4, and each NAP is associated with 4 buffers. When an Ethernet packet arrives, the four 256-bit segments in each cycle are sent in parallel to four buffers of the same NAP. For example, the segments of an Ethernet packet for NAP 1 would go to the buffers labeled as 1, the segments for NAP 2 to buffers 2, the segments for NAP 3 to buffers 3, and the segments for NAP 4 to buffers 4. In order to efficiently fill the buffers, the fill levels of the buffers are examined to select the buffer that is least full or empty to provide load balancing.

The path for NAPs 1 and 3 is the same coming out of the Ethernet MAC 1301, but pointer control 1308 will add the data to the top buffer or the bottom buffer depending on the receiving NAP.

On the way out of the buffer towards the iNOC 120, the pointer control 1308 selects the data from one of the buffers, top or bottom, and the Ethernet controller 114 activates the corresponding input of the multiplexer 1316.

Figure 15:
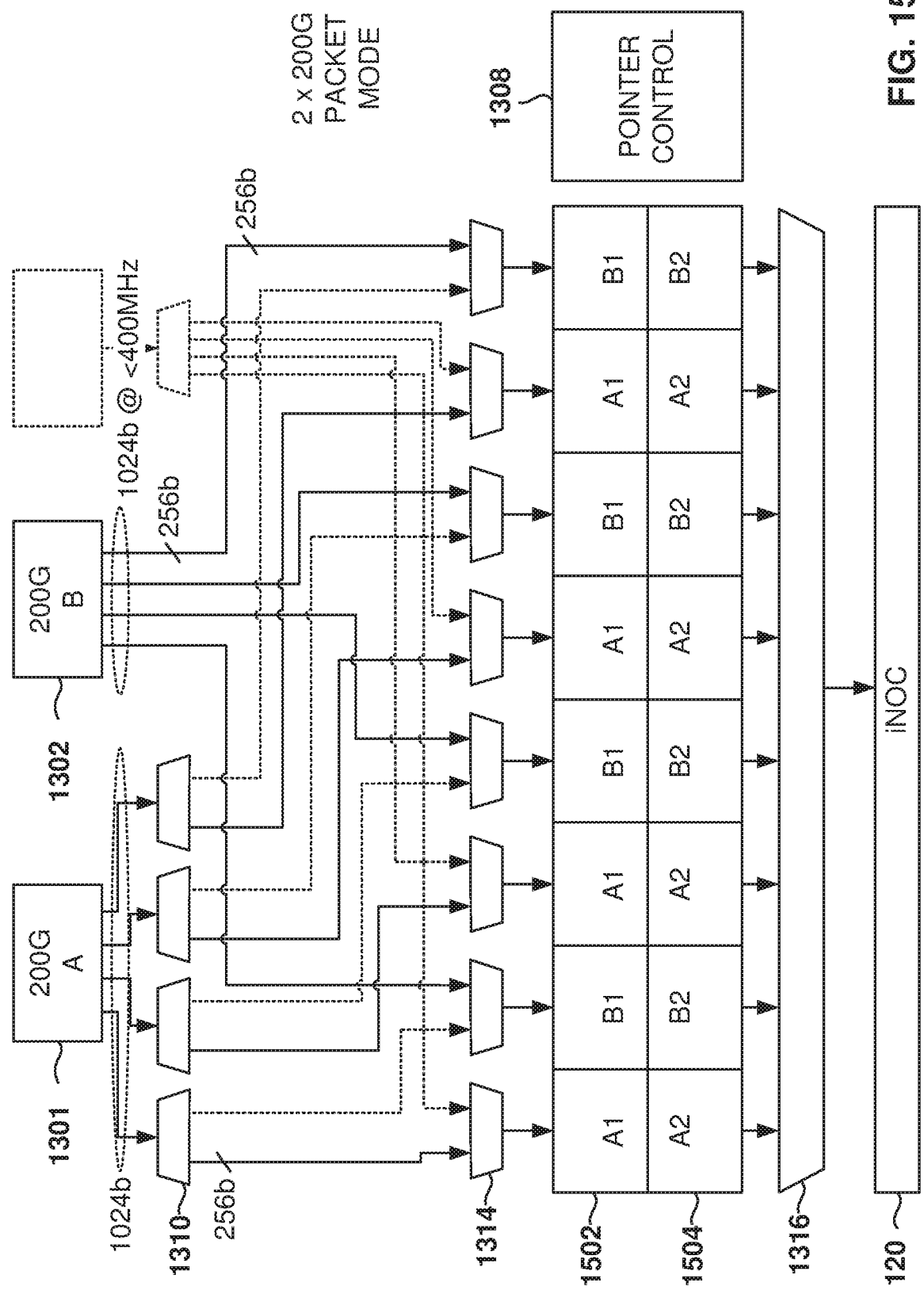
FIG. 15 illustrates the simultaneous use of two 200G Ethernet interfaces in packet mode, according to some example embodiments.

FIG. 15 illustrates the simultaneous use of two 200G Ethernet interfaces in packet mode, according to some example embodiments. The Ethernet MAC 1301 (referred to as 200GA) is set to operate at 200G instead of 400G as shown in FIG. 14. The Ethernet MAC 1302 (referred to as 200 GB) provides the second 200G interface. Each 200G interface provides a 1024 bit-wide stream up to 400 MHz (e.g., 300 MHz).

The 200G A segment flow goes through demultiplexers 1310 that connect their outputs to the odd buffers (first, third, fifth, and seventh). The stream from 200 GB is connected to multiplexers 1314 of the even buffers.

As with the 400G mode, the buffers are split in two buffers 1502 and 1504. Four NAPs are associated with the Ethernet packets referred to as A1, A2, B1, and B2. A1 and A2 are associated with the flow from 200G A and B and B2 with the flow from 200G B.

It is noted that the buffers for 200G A and 200G B are independent from each other and can be run on different clocks to synchronize with the respective MAC.

In the 400G packet mode, there is one channel that provides 1028 bits per cycle. With two 200G packet modes interfaces, the stream width of 1028 bits is the same, but the frequency is half; therefore, the throughput is the same for the one 400G and the two 200Gs. On the way out to the iNOC 120 column, the operation is the same as described with reference to FIG. 14.

Figure 16:
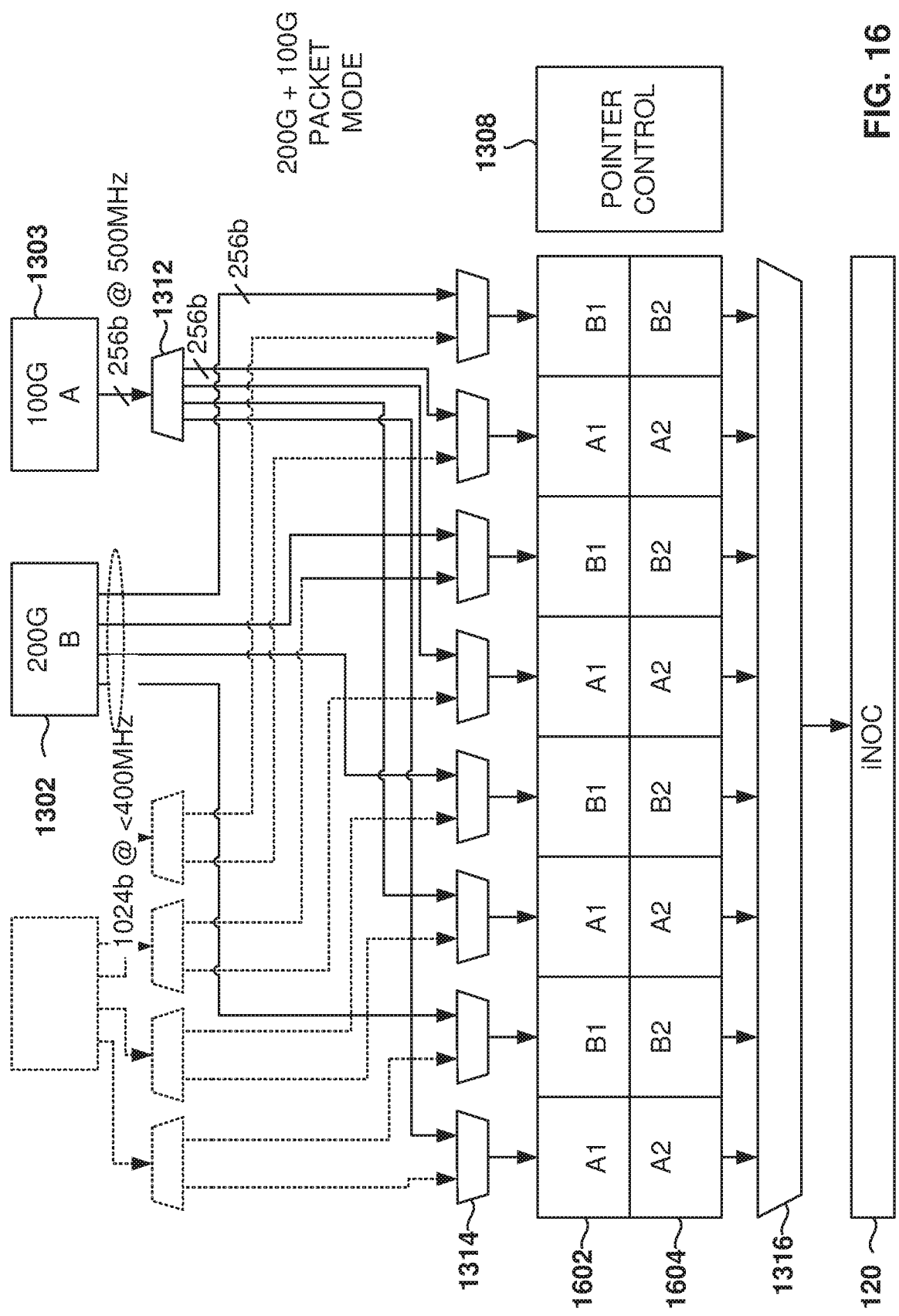
FIG. 16 illustrates the simultaneous use of one 200G Ethernet interface and one 100G interface in packet mode, according to some example embodiments.

FIG. 16 illustrates the simultaneous use of one 200G Ethernet interface and one 100G interface in packet mode, according to some example embodiments. In this mode, Ethernet MAC 1302 for 200G interface and Ethernet MAC 1303 for 100G interface are active.

The Ethernet MAC 1302 (referred to as 200G B) provides a 1024-bit wide stream at less than 400 MHz (e.g., 300 MHz) and the Ethernet MAC 1303 (referred to as 100G A) provides a 256-bit wide stream at 500 MHz or less.

As previously discussed, the 200G B Ethernet sends four segments in parallel to the buffers each cycle. On the other hand, the 100G A sends one 256 segment each cycle that can be directed to one of eight buffers (four buffers 1602 labeled A1 and four buffers 1604 labeled A2). Therefore, 1024 bits of an Ethernet packet coming through the 100G interface will be sent to the buffers in four clock cycles.

The wiring from Ethernet MAC 1302 connects each of the segments to one of the odd multiplexers 1314 and the output of the Ethernet MAC 1303 goes through the demultiplexer 1312 that has four outputs, each output connected to one of the odd multiplexers 1314. Therefore, each multiplexer 1314 has one input active and the output connected to the corresponding buffers.

As before, there are four NAPs active in packet mode that are labeled A1. A2, B1, and B2. The path out to the iNOC 120 column goes through mulipexer 1316 as in the previous modes.

Figure 17:
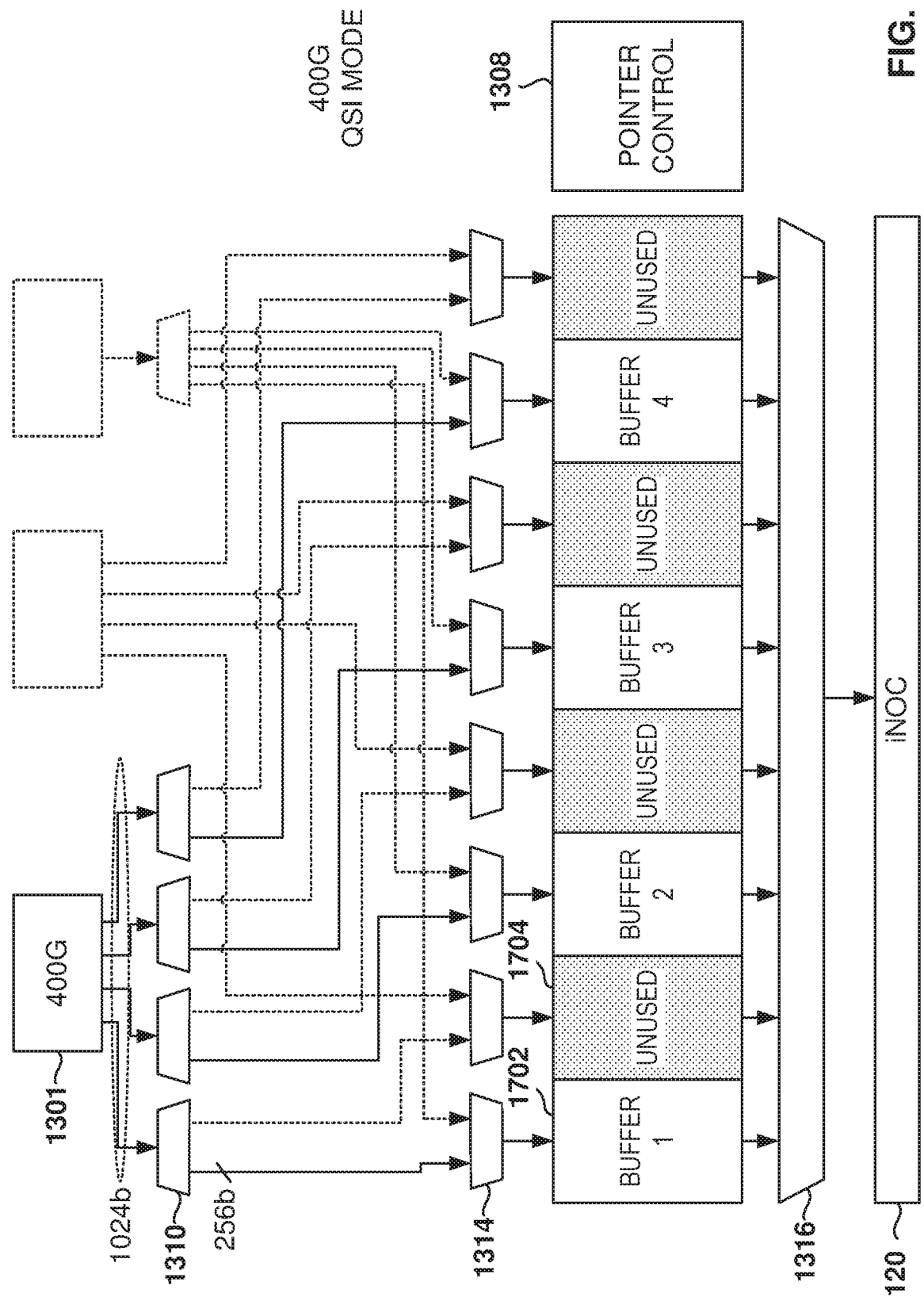
FIG. 17 illustrates the 400G Ethernet mode in quad segment interface (QSI) mode, according to some example embodiments.

FIG. 17 illustrates the 400G Ethernet mode in QSI mode, according to some example embodiments. In QSI mode, the 1024 bits of the Ethernet packet received in one cycle are divided into four 256 segments, and each segment is sent to a different NAP.

In 400G QSI mode, four of the eight buffers 1702 are used and the other four buffers 1704 are not used. The incoming 1024 bits are sent to the four buffers 1702 via the demultiplexers 1310 and the multiplexers 1314. One of the outputs from each demultiplexer 1310 is connected to a respective muiplexer 1314. Each of the multiplexers 1314 of the active buffers 1702 connect the one input to the output that is connected to the buffer 1702.

Figure 18:
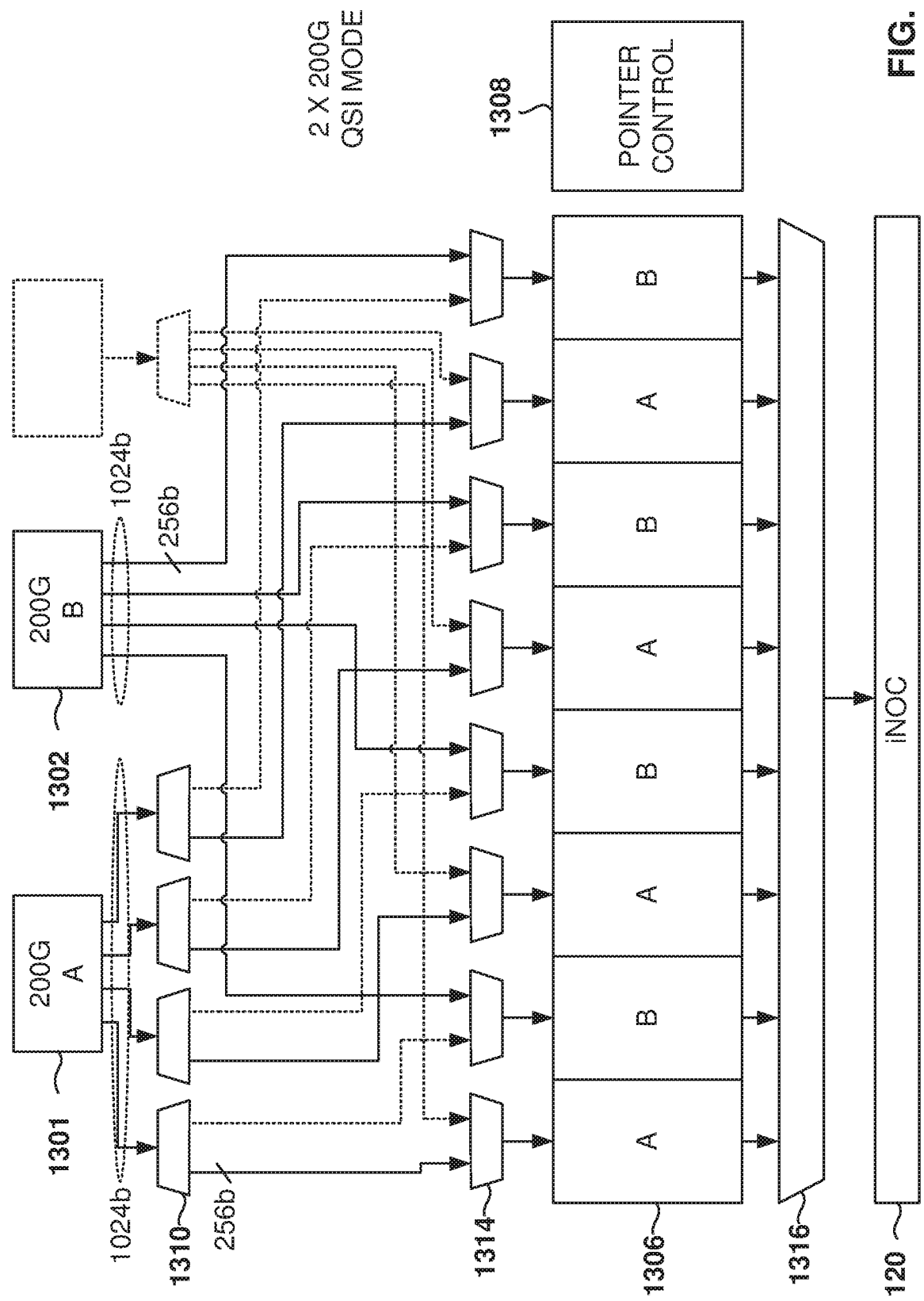
FIG. 18 illustrates the simultaneous use of two 200G Ethernet interfaces in QSI mode, according to some example embodiments.

FIG. 18 illustrates the simultaneous use of two 200G Ethernet interfaces in QSI mode, according to some example embodiments. The wiring for the two 200Gs in QSI mode is the same as described earlier with reference to FIG. 15 for the packet mode. However, in QSI mode the buffers 1306 are not split in two.

The Ethernet MAC 1301 (200G A) uses the odd buffers and the Ethernet MAC 1302 (200G B) uses the even buffers. The pointer control 1308 treats each buffer as a FIFO queue with a write pointer and a read pointer.

When the segments from the buffers 1306 are sent to the iNOC 120 column, the multiplexer 1316 selects data from four buffers (A or B) at the same time and the data is sent in parallel to four different NAPs, as described above with reference to FIG. 5. It is noted that other combinations the different Ethernet QSI modes are also possible, such as multiple 100Gs, a combination of 200G and 100G, etc.

Figure 19:
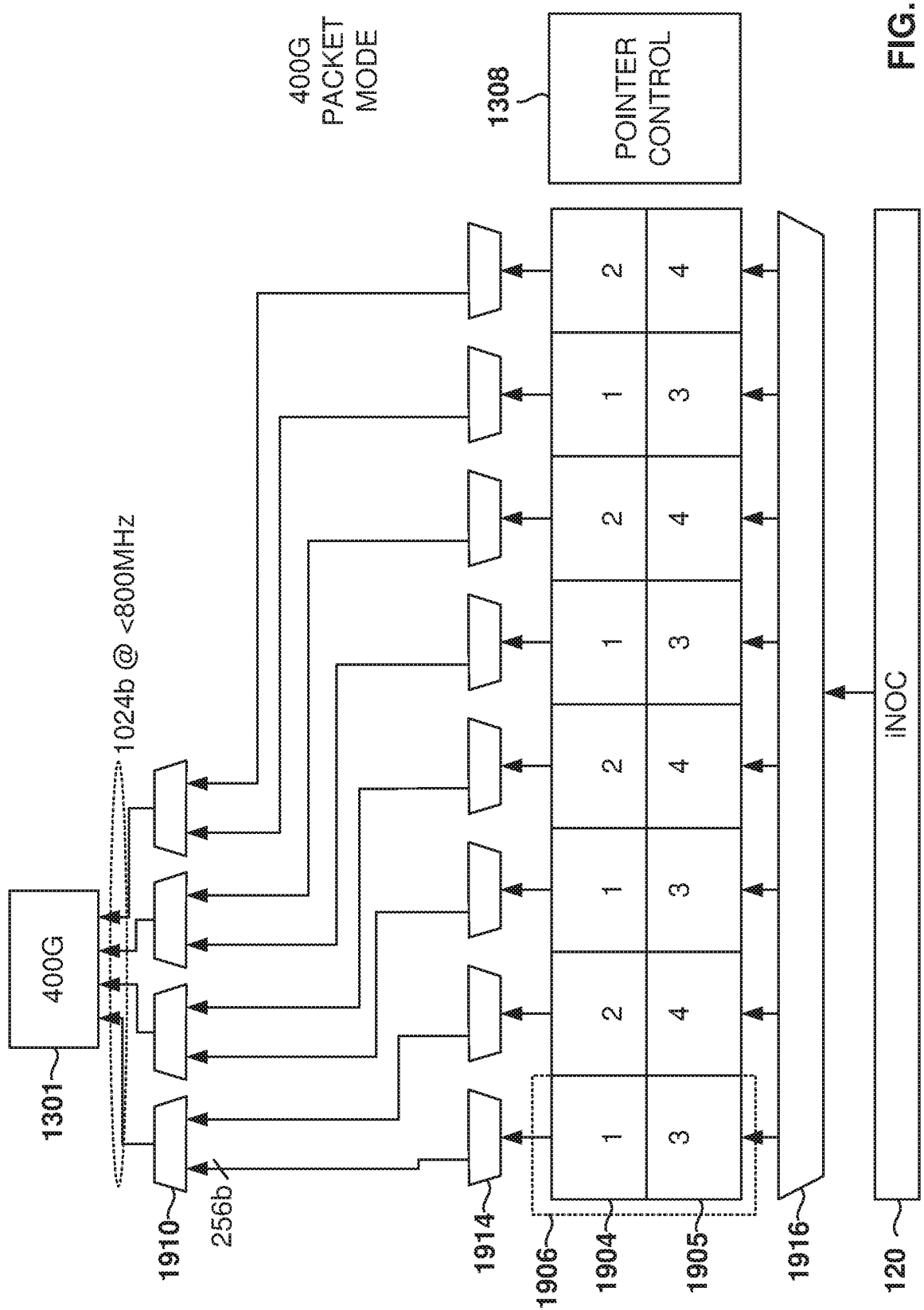
FIG. 19 illustrates the outbound processing of 400G Ethernet in packet mode, according to some example embodiments.

FIG. 19 illustrates the outbound processing of 400G Ethernet in packet mode, according to some example embodiments. In the outbound direction (transmit), the buffer structure is the same as in FIG. 14 for the Rx mode, but the data flowing in the opposite direction. The buffers 1906 are divided into two sub-buffers 1904 and 1905, which are controlled by pointer control 1308. The data for each NAP is distributed throughout the buffers, so when an Ethernet packet from one of the NAPs is sent to the Ethernet MAC 1301, a complete 1024-bit segment can be formed by joining together four 256-bit segments.

Figure 20:
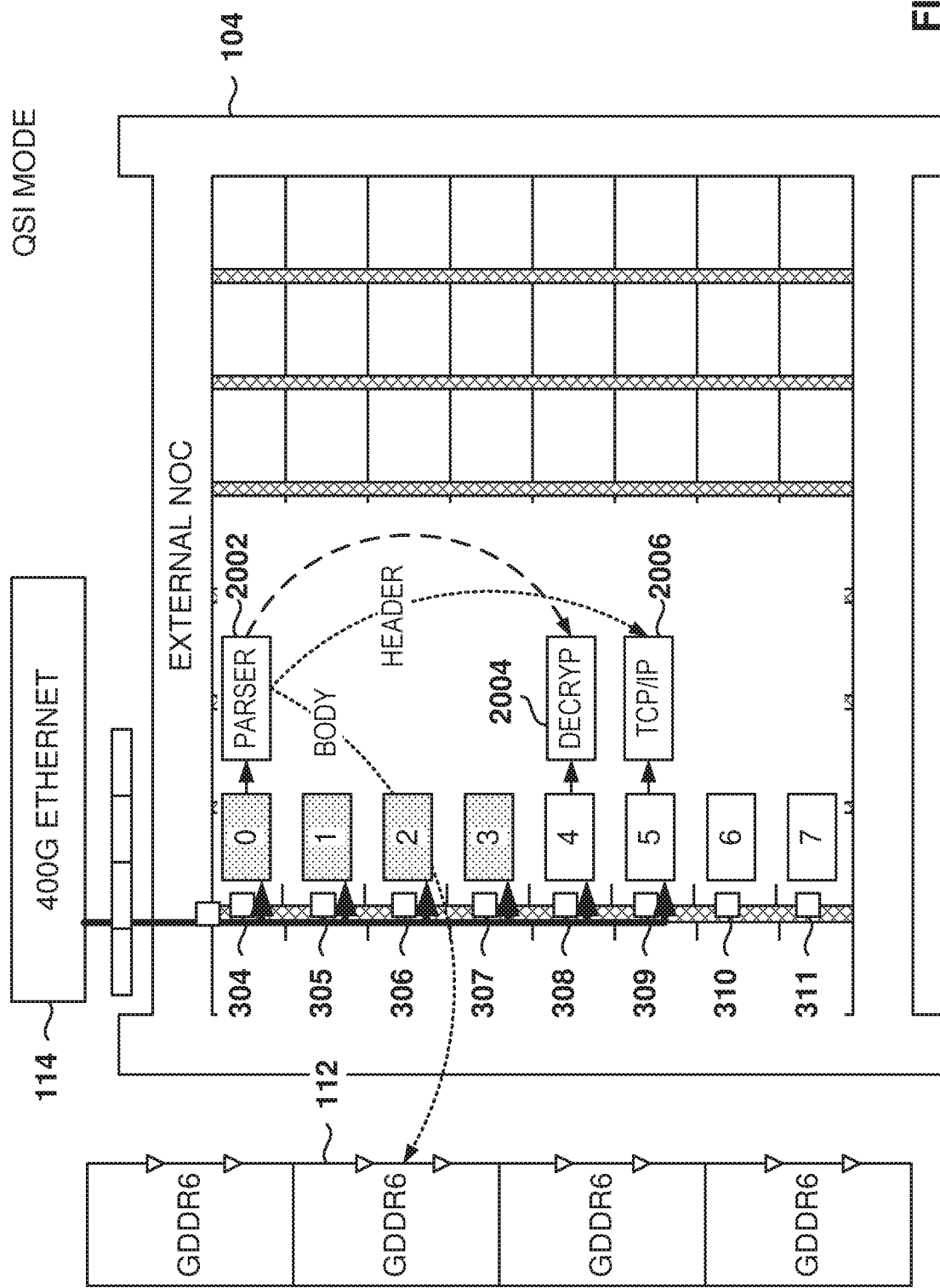
FIG. 20 illustrates the versatility of the NOC for processing Ethernet packets, according to some example embodiments.

FIG. 20 illustrates the versatility of the NOC for processing Ethernet packets, according to some example embodiments. Typically, a parser 2002 is used to examine Ethernet packets and decide how to handle the Ethernet packets, such as by sending the packets to a decryption engine 2004 for decryption or to a TCP/IP engine 2006 for network communications.

In QSI mode, the beginning of the Ethernet packet can be at one of four locations. In the illustrated example, the segments are sent to one of the NAPs 304-307 (labeled as NAP 0 to NAP 3). Therefore, four parsers 2002 are needed, one for each NAPs 304-307 (only one parser 2002 is shown). This increases the complexity of the user logic.

In some example embodiments, the FPGA provides great flexibility on the routing of data for processing. A segment received at one NAP can be quickly sent to another NAP, which may be in the same column or the same row. In some cases, the segment can be sent without having to store and forward the segment just by using the underlying AXI transport capabilities of the iNOC.

This routing flexibility enables the sharing of blocks, such as compression and decryption engines. For example, in QSI mode, NAP 304 receives a segment that contains the beginning of the Ethernet packet. The parser 2002 examines the header and determines that the packet has to be decrypted and decides to send it down the column to NAP 308 connected to user logic that has a decryption engine 2004.

NAP 304 notifies NAP 308 that the segment on the bus needs to be delivered to the user logic. Therefore, there is no store-and-forward required because that multicast capabilities on the iNOC column allow the segment to be delivered to NAP 4. Similarly, other NAPs can send Ethernet packets to be decrypted to decryption engine 2004. Therefore, the decryption engine 2004 may be shared by multiple NAPs.

In some example embodiments, the parser 2002 detects a TCP/IP header in the Ethernet packet. Using the AXI transport of the iNOC, the parser 2002 decides to forward the segment to the TCP/IP engine 2006 down the column, in the same way as described above for the decryption case, but since the TCP/IP engine 2006 only needs the header of the Ethernet packet, the parser 2002 sends the body, also referred to as payload, of the Ethernet packet to memory, e.g., GDDR6 controller 112, via the iNOC 120 and the eNOC 104.

The user logic can determine how to process the TCP/IP packet and then pass the packet to another block of user logic, e.g., an IP router, by passing along the Ethernet header and the memory information where the payload is stored.

Sending to memory may also be used by the decryption engine 2004. This way, the decryption engine 2004 does not get flooded with all the segments to be decrypted, and instead, the decryption engine 2004 processes the Ethernet packets serially, requesting one new packet for decryption from memory as the decryption engine 2004 gets freed.

The same principles may be used for other scenarios. For example, the parser 2002 may perform deep inspection of the Ethernet packet, going beyond the TCP/IP headers into the application part of the packet, to determine if the packet corresponds to a video stream (e.g., streaming a movie to a user). In this case, another handler may be used for streaming video, and the parser 2002 will send the Ethernet packets to the streaming video handler, instead of sending them to the TCP/IP engine 2006.

Figure 21:
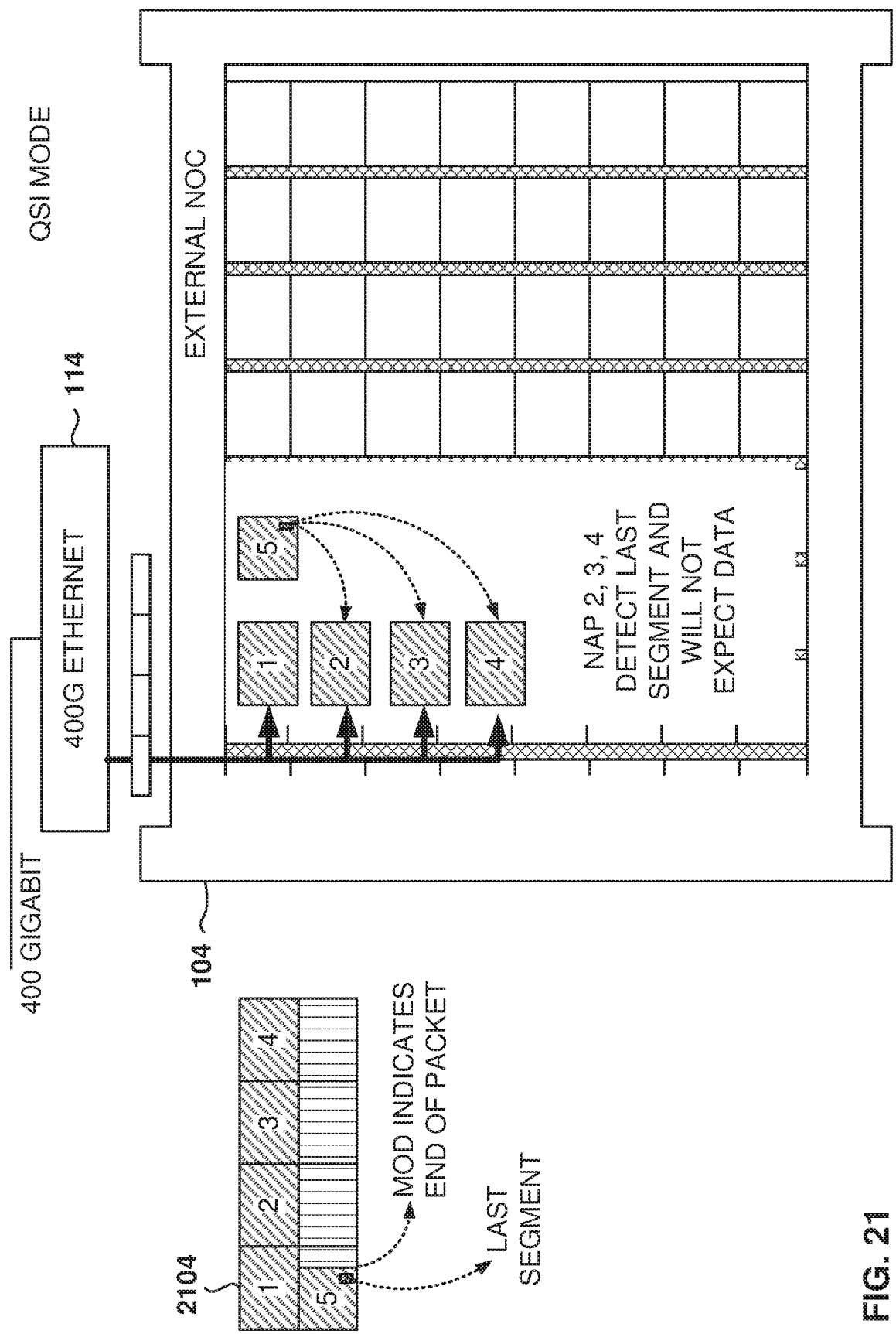
FIG. 21 illustrates use of an end-of-packet marker for saving NOC bandwidth, according to some example embodiments.

FIG. 21 illustrates use of an end-of-packet marker for saving NOC bandwidth, according to some example embodiments. In some example embodiments, custom signaling is used to improve bandwidth utilization. This method is referred to herein as a compression method because it improves bandwidth utilization, although no actual compression of the segments is performed to reduce the number of bytes actually carrying the information.

In some example embodiments, instead of using QSI to divide data into segments, the beginning of the Ethernet packet (e.g., 2104) is always sent to one NAP (e.g., NAP 1) in parallel with data sent to other three NAPs (e.g., NAPs 2-4). As described above with reference to FIG. 4, this scenario means that there could be a large amount of wasted bandwidth and the result is that the FPGA core has to be run at a high clock (724 Hz) to keep up with a 400G Ethernet.

A last-segment indicator, also referred to as End of Packet (EOP), is associated with the last segment in the Ethernet packet and the last-segment indicator is made available to all the NAPs. In some example embodiments, the segment 5 is multicast to NAPs 1-4. This way, if the last segment arrives on NAP 1, it is not necessary to encode that there are three empty segments going to NAPs 2-4 in the next cycles. Thus, the bandwidth that would be assigned to NAPs 2-4 in those cycles can be used for other communication purposes on the iNOC column.

Further, a value referred to as MOD is shared among NAPs 1-4. The MOD is an integer that indicates how many bytes of data are included in the last segment (e.g., 4 bytes used, which means 28 bytes are unused).

Figure 22:
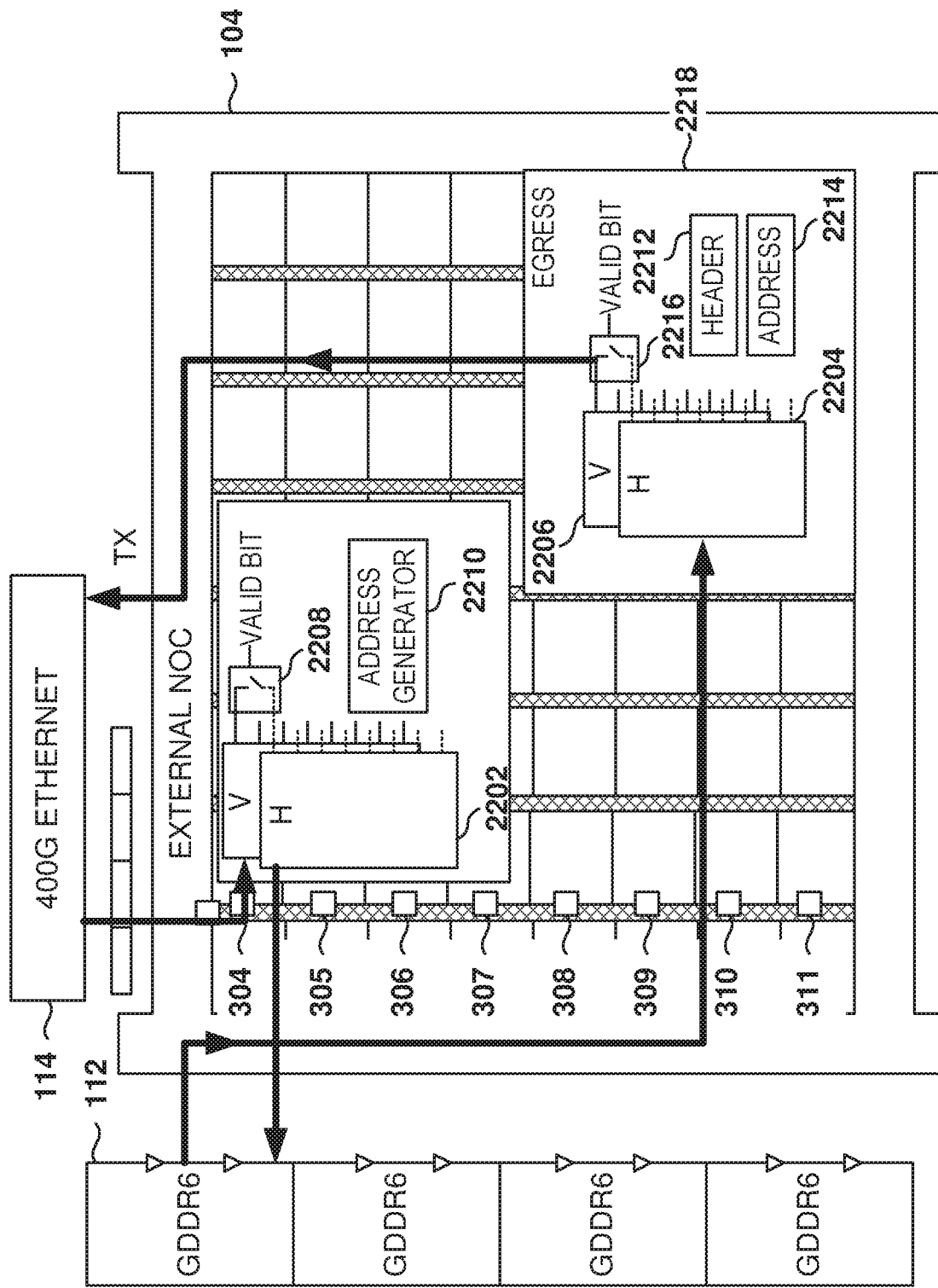
FIG. 22 illustrates the efficient routing of packets using vertical and horizontal communications, according to some example embodiments.

FIG. 22 illustrates the efficient routing of packets using vertical and horizontal communications, according to some example embodiments. In some example embodiments, the horizontal NAP 304 (for communications along the rows) is collocated with the vertical NAP 2202 (for communications along the columns) of the iNOC.

The horizontal NAP 304 and the vertical NAP 2202 are collocated because they are physically proximate to each other, so communications from the rows can quickly be routed to the columns and vice versa. In some example embodiments, a gate 2208 connects a wire from the vertical NAP 2202 to the horizontal NAP 304, and the gate 2208 is controlled by a signal referred to as valid bit, such that when the valid bit is set to logical 1, then the two wires are connected together. The gate 2208 could be an AND logical gate with inputs of the valid bit and the vertical wire and output is the horizontal wire. One gate 2208 is illustrated, but additional gates are also placed for the rest of the wires in the vertical NAP 2202, and the gates for all the wires share the valid-bit signal as an input.

Because the horizontal and vertical NAPs are collocated, sending data from the column to the row is fast and efficient, and the logic takes a very small amount of space in the FPGA core.

Further, in some example embodiments, the vertical NAP 2202 wires and the horizontal NAP 304 wires are interleaved; that is, the horizontal wires are placed alternately between the vertical wires in the same block. Because the wires are interleaved, the redirection of the data from one direction to another is very quick and the logic takes a very small amount of space on the FPGA.

As discussed above with reference to FIG. 20, the parser 2002 analyzes the Ethernet header and sends the payload of the Ethernet packet to external memory (e.g., GDDR6 controller 112). Therefore, an easy and fast way to send the payload to memory is to simply redirect the Ethernet packet payload coming down the iNOC column to the iNOC row by setting the valid bit and transmitting the incoming segments to the eNOC 104 and the memory GDDR6 controller 112.

For example, the parser 2002 looks at the incoming header and decides to send the payload to memory for later processing (e.g., TCP/IP packet being routed to the next destination as the FPGA acts as a network router). After some bytes of the beginning of the packet are received (e.g., the header plus 0 or more bytes), the parser 2002 quickly determines, in real time, that the payload will be sent to memory.

The user logic then activates the valid bit to copy the Ethernet packet bits from the vertical NAP 2202 to the horizontal NAP 304. As the data comes in, the data is sent towards the memory, without having to store the complete Ethernet packet.

An address generator 2210 in the user logic generates the memory address where the data is to be stored; the address is then used for routing the data to the memory (e.g., GDDR6 controller 112).

The iNOC 120 provides great flexibility to the user logic for quickly routing data from one place in the FPGA to another. The design of the user logic is simpler because the designer does not need to plan for complicated storing and forwarding of data within the FPGA.

On the outbound direction, typically, there will be an egress block 2218 of user logic that sends Ethernet packets to the outside of the FPGA. In some cases, the Ethernet packet payload is in memory, so the egress block 2218 has header information 2212 and address information 2214 of the Ethernet packet, where the address information 2214 is the address in the external memory that holds all or part of the Ethernet packet. In some cases, the whole packet is stored in memory so the header information 2212 is not required.

As in the inbound direction, the vertical NAP 2206 and the horizontal NAP 2204 are collocated and interleaved. A valid bit 2216 is used to connect the wires of the horizontal NAP 2204 to the wires of the vertical NAP 2206.

The egress block 2218 then issues a read request (e.g., AXI command) to get the Ethernet data from memory, and the Ethernet data arrives via the iNOC row. As the data arrives, the data is immediately copied to the iNOC column via the vertical NAP 2206. The data then travels up through the column to the eNOC 104 and then to Ethernet controller 114.

If the header information 2212 is not in memory, the egress block 2218 attaches the header information 2212 and then sends the header information 2212 and the payload coming from memory to the eNOC 104.

In some example embodiments, the payload of the Ethernet packet is striped across multiple external memories (e.g., GDDR6 controller 112), which means that the data is stored in several memories. For example, a first chunk is stored in a first memory, a second check in a second memory, etc.

When getting the Ethernet data, the egress block 2218 issues multiple reads for the different memories. This way, the possibilities of a deadlock or a bottleneck are reduced because the access to memory is load balanced.

Figure 23:
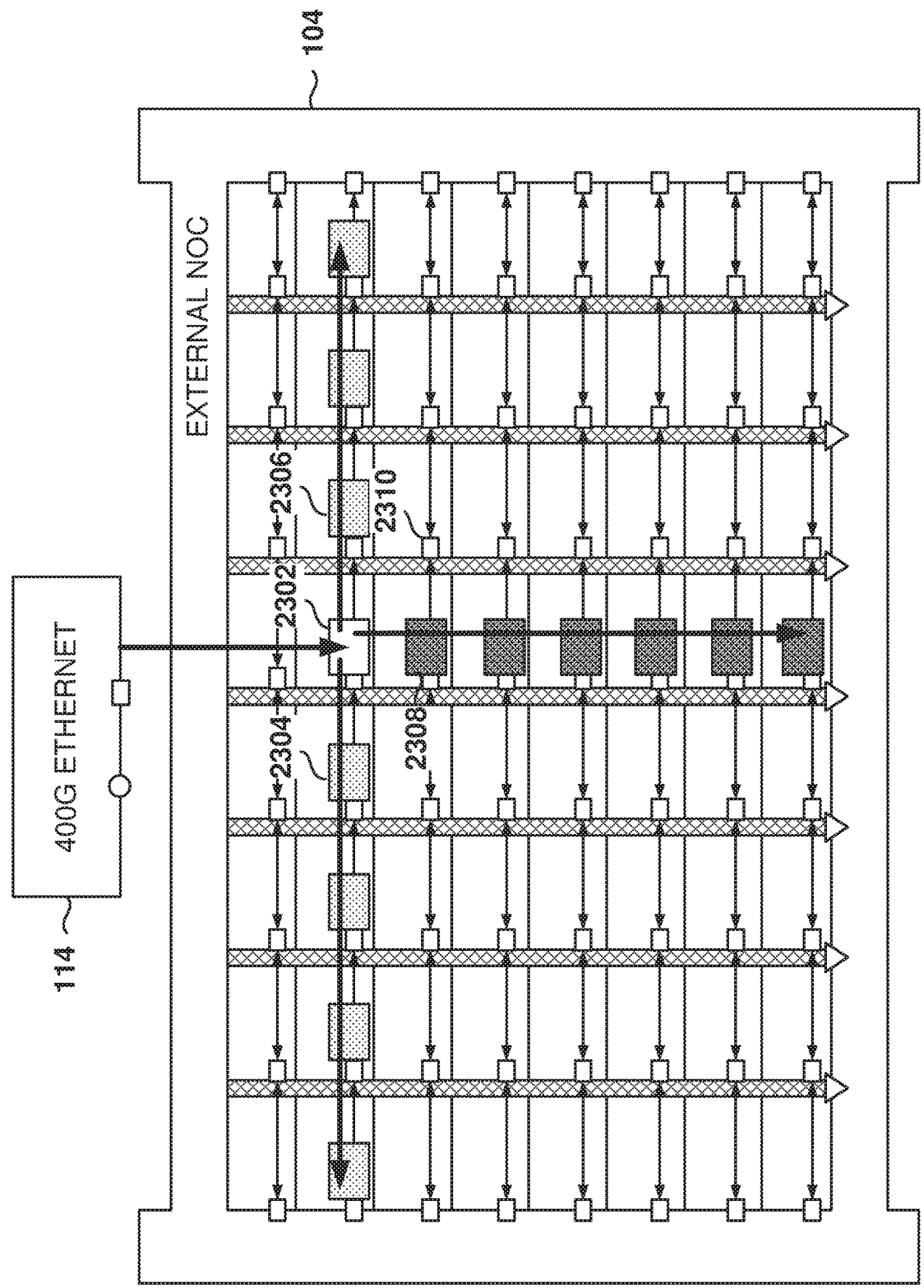
FIG. 23 illustrates the versatile routing of packets using multiple paths, according to some example embodiments.

FIG. 23 illustrates the versatile routing of packets using multiple paths, according to some example embodiments. When an Ethernet packet arrives at NAP 2302, the user logic may command the NAP 2302 to forward the westbound (e.g., NAP 2304) or eastbound (e.g., NAP 2306), and in the vertical direction, typically downward (e.g., NAP 2308), although the NAP 2302 may also send the data upward in a different cycle.

In some example embodiments, the transport in the iNOC uses AXI, which includes flit-to-flit transfer capabilities. This way, the data can be sent from one end of the FPGA to another end. In traditional approaches, the network traffic at the FPGA is handled in one location, which causes congestion in the area. However, with the current approach, the processing of network traffic may be distributed throughout the FPGA. For example, the egress block 2218 of FIG. 22 is situated far away from the NAP 304 that parses the Ethernet headers.

Further, the encryption engine may be located at user logic coupled to NAP 2306 without having to send the data down on the iNOC column, and the TCP/IP engine may be situated at the user logic coupled to NAP 2306. Furthermore, other NAPs (e.g., NAP 2308) can send Ethernet packets to the decryption engine coupled to NAP 2306 by sending the data on a different row and then up another column. For example, NAP 2308 could send encrypted packets via NAP 2310 that forwards the encrypted packets to NAP 2306.

And all this traffic is possible without having to store and forward the packets, which greatly improves efficiency and processing speed. The forwarding can be on the same cycle as the one on which the data arrives (e.g., from Ethernet controller 114).

In some example embodiments, the iNOC column includes the valid signal, a ready signal, and a destination signal. The ready signal indicates when the vertical iNOC is ready to accept data. The destination signal includes the address of the NAP that is the destination for the data. At every cycle, the valid signal and the destination signal are specified to route the data to its destination.

Each NAP can be configured for streaming mode, which means that the data is forwarded to another NAP as the data is being received. For example, by setting the valid signal to active, data is redirected towards another NAP in the iNOC row. The NAPs may also be configured as AXI nodes, which means that the data will use flits to be transferred through the iNOC.

Further, the flexible network capabilities of the iNOC also help to ease the handling of Ethernet packets in packet mode. In fact, packet mode may be very useful in certain cases. Since all data for one Ethernet packet comes to the same NAP, this NAP can parse the header and then determine where to send the header and the payload. As the additional segments of the Ethernet packet arrive to the NAP with the parser, the segments are then quickly streamed to other NAPs or to memory. The encrypted packet will be sent to the decryption engine one segment at a time, so the decryption engine will not be overwhelmed with too much data.

FIG. 24 is a flowchart of a method 2400 for processing Ethernet packets at an FPGA, according to some example embodiments. At operation 2402, a programmable integrated circuit receives a configuration for the programmable integrated circuit. The programmable integrated circuit comprises: an internal network on chip (iNOC) comprising iNOC rows and iNOC columns; a plurality of clusters coupled to the iNOC, each cluster comprising a network access point (NAP) and programmable logic; and an Ethernet controller coupled to the iNOC. The Ethernet controller is configurable to operate in packet mode where each complete inbound Ethernet packet is sent from the Ethernet controller to one of the NAPs via the iNOC, and two or more NAPs are configurable to receive the complete inbound Ethernet packets from the Ethernet controller. The method 2400 further includes an operation 2404 for providing Ethernet communications for the plurality of clusters via the Ethernet controller.

In one example, the Ethernet controller is configured to: receive the inbound Ethernet packet using a first data path having a width of a first number of bits, break the received inbound Ethernet packet into segments having a second number of bits, and send each segment to one of the NAPs via the iNOC.

In one example, the Ethernet controller includes a plurality of buffers for buffering the inbound Ethernet packets before sending segments of the inbound Ethernet packets to the NAPs via the iNOC.

In one example, the Ethernet controller comprises a pointer control module with a plurality of pointers to control storage of data into the plurality of buffers.

In one example, each buffer is reserved for communications with one of the NAPs.

In one example, each buffer is divided into two sub-buffers and each sub-buffer is reserved for communications with one of the NAPs.

In one example, the Ethernet controller includes a plurality of outbound buffers for buffering outbound Ethernet packets received from the NAPs via the iNOC.

In one example, the Ethernet controller provides a fill-level signal for each outbound buffer to the plurality of clusters, the fill-level signal being activated when a predetermined amount of the buffer is filled.

In one example, the Ethernet controller provides, to the plurality of clusters, a plurality of buffer-level-reached signals for each outbound buffer, each buffer-level-reached signal being activated when a respective predetermined amount of the buffer is filled.

In one example, the Ethernet controller is configurable to detect an activation of a cut-through threshold level for one of the outbound buffers, wherein the Ethernet controller starts transmitting one Ethernet packet in the outbound buffer when the cut-through threshold level is activated even if the complete Ethernet packet is not available in the outbound buffer.

In one example, the Ethernet controller is a 400G Ethernet controller.

In one example, the programmable integrated circuit includes another Ethernet controller, where the Ethernet controller and the other Ethernet controller share buffers for the inbound Ethernet packets.

FIG. 25 is a flowchart of a method 2500 for distributing Ethernet packets at the FPGA, according to some example embodiments. The method 2500 includes an operation 2502 for receiving, at a programmable integrated circuit, a configuration for the programmable integrated circuit, the programmable integrated circuit comprising: an internal network on chip (iNOC) comprising iNOC rows and iNOC columns; a plurality of clusters coupled to the iNOC, each cluster comprising a vertical network access point (NAP) for iNOC column communications, a horizontal NAP for iNOC row communications, a valid signal, and programmable logic, wherein the vertical NAP is connected to the horizontal NAP when the valid signal is activated; and an Ethernet controller coupled to the iNOC, the Ethernet controller configurable to send Ethernet-packet segments to the vertical NAPs.

The method 2500 further includes an operation 2504 for providing Ethernet communications for the plurality of clusters via the Ethernet controller.

In one example, the wires connecting the vertical NAP to the iNOC column are interleaved with wires connecting the horizontal NAP to the iNOC row.

In one example, a first cluster includes a first vertical NAP and a parser in the programmable logic, the parser analyzing a header of an inbound Ethernet packet to determine processing of the inbound Ethernet packet.

In one example, the parser sends a header of a TCP/IP Ethernet packet to a second NAP by adding an address of the second NAP as the destination of part of the Ethernet packet, wherein the parser sends a payload of the TCP/IP Ethernet packet to a memory via one iNOC row.

In one example, a third NAP in a third cluster is used for sending outbound Ethernet packets, wherein the third cluster retrieves a payload of the outbound Ethernet packet from the memory and sends the outbound packet to the Ethernet controller via one of the iNOC columns.

In one example, the parser redirects the inbound Ethernet packet to a decryption engine in a fourth NAP in a fourth core via the iNOC column.

In one example, the parser redirects the inbound Ethernet packet to a decryption engine in a fifth NAP in a fifth core via one of the iNOC rows by activating the valid signal.

In one example, the Ethernet controller is configurable to operate in Quad Segment Interface (QSI) to: receive an inbound Ethernet packet using a first data path having a width of a first number of bits, break the received inbound Ethernet packet into four segments having a second number of bits, and send each segment to one of four NAPs in one of the iNOC columns.

In one example, the four NAPs share a decryption engine.

In one example, the four NAPs share a MOD value indicating an end of the inbound Ethernet packet.

Figure 26:
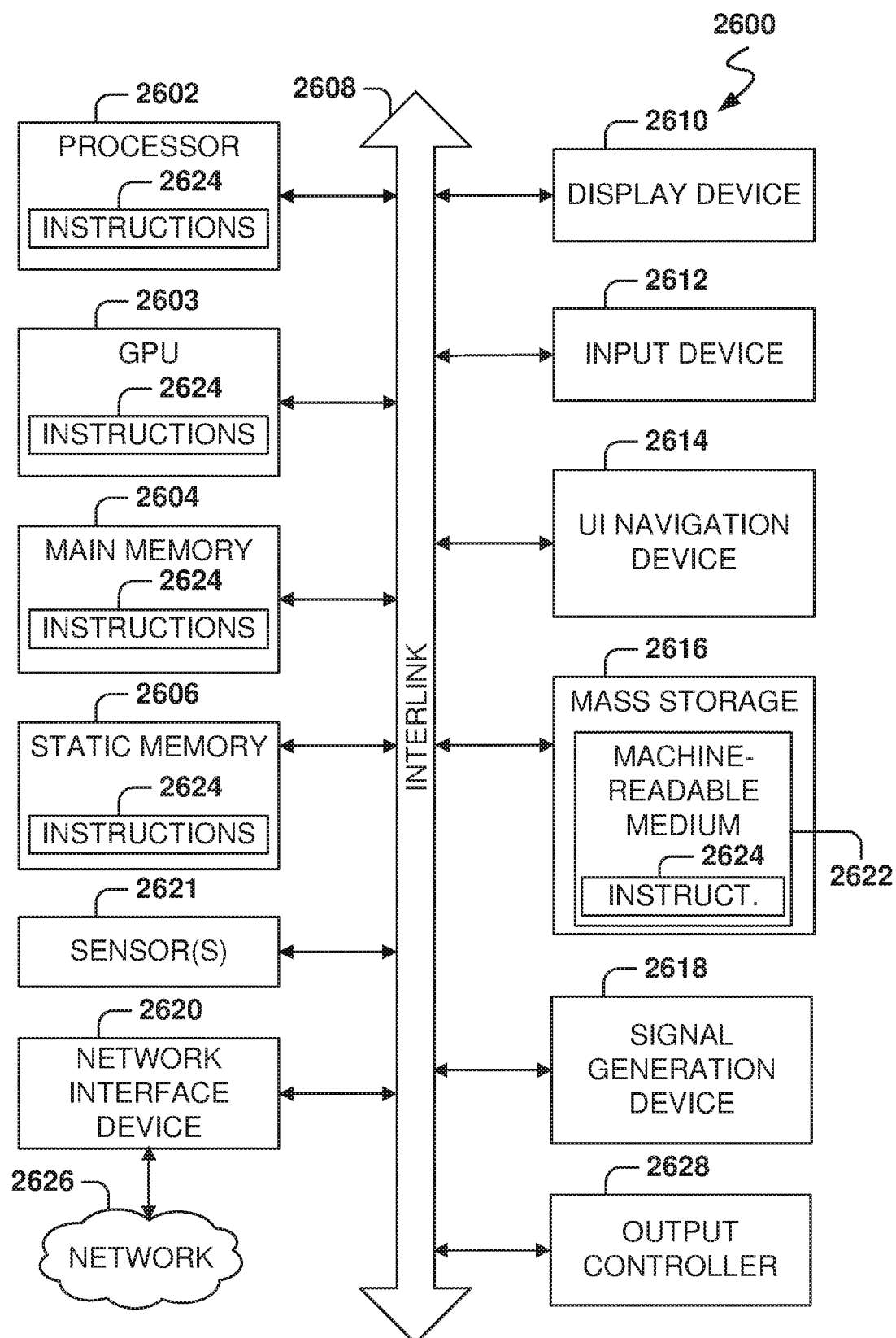
FIG. 26 is a block diagram illustrating an example of a machine upon or by which one or more example process embodiments described herein may be implemented or controlled.

FIG. 26 is a block diagram illustrating an example of a machine 2600 upon or by which one or more example process embodiments described herein may be implemented or controlled. In alternative embodiments, the machine 2600 may operate as a standalone device or may be connected (e.g., networked) to other machines. In a networked deployment, the machine 2600 may operate in the capacity of a server machine, a client machine, or both in server-client network environments. In an example, the machine 2600 may act as a peer machine in a peer-to-peer (P2P) (or other distributed) network environment. Further, while only a single machine 2600 is illustrated, the term "machine" shall also be taken to include any collection of machines that individually or jointly execute a set (or multiple sets) of instructions to perform any one or more of the methodologies discussed herein, such as via cloud computing, software as a service (SaaS), or other computer cluster configurations.

Examples, as described herein, may include, or may operate by, logic, a number of components, or mechanisms. Circuitry is a collection of circuits implemented in tangible entities that include hardware (e.g., simple circuits, gates, logic). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits) including a computer-readable medium physically modified (e.g., magnetically, electrically, by moveable placement of invariant massed particles) to encode instructions of the specific operation. In connecting the physical components, the underlying electrical properties of a hardware constituent are changed (for example, from an insulator to a conductor or vice versa). The instructions enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 2600 may include a hardware processor 2602 (e.g., a central processing unit (CPU), a hardware processor core, or any combination thereof), a graphics processing unit (GPU) 2603, a main memory 2604, and a static memory 2606, some or all of which may communicate with each other via an interlink (e.g., bus) 2608. The machine 2600 may further include a display device 2610, an alphanumeric input device 2612 (e.g., a keyboard), and a user interface (UI) navigation device 2614 (e.g., a mouse). In an example, the display device 2610, alphanumeric input device 2612, and UI navigation device 2614 may be a touch screen display. The machine 2600 may additionally include a mass storage device (e.g., drive unit) 2616, a signal generation device 2618 (e.g., a speaker), a network interface device 2620, and one or more sensors 2621, such as a Global Positioning System (GPS) sensor, compass, accelerometer, or another sensor. The machine 2600 may include an output controller 2628, such as a serial (e.g., universal serial bus (USB)), parallel, or other wired or wireless (e.g., infrared (IR), near field communication (NFC)) connection to communicate with or control one or more peripheral devices (e.g., a printer, card reader).

The mass storage device 2616 may include a machine-readable medium 2622 on which is stored one or more sets of data structures or instructions 2624 (e.g., software) embodying or utilized by any one or more of the techniques or functions described herein. The instructions 2624 may also reside, completely or at least partially, within the main memory 2604, within the static memory 2606, within the hardware processor 2602, or within the GPU 2603 during execution thereof by the machine 2600. In an example, one or any combination of the hardware processor 2602, the GPU 2603, the main memory 2604, the static memory 2606, or the mass storage device 2616 may constitute machine-readable media.

While the machine-readable medium 2622 is illustrated as a single medium, the term "machine-readable medium" may include a single medium, or multiple media, (e.g., a centralized or distributed database, and/or associated caches and servers) configured to store the one or more instructions 2624.

The term "machine-readable medium" may include any medium that is capable of storing, encoding, or carrying instructions 2624 for execution by the machine 2600 and that cause the machine 2600 to perform any one or more of the techniques of the present disclosure, or that is capable of storing, encoding, or carrying data structures used by or associated with such instructions 2624. Non-limiting machine-readable medium examples may include solid-state memories, and optical and magnetic media. In an example, a massed machine-readable medium comprises a machine-readable medium 2622 with a plurality of particles having invariant (e.g., rest) mass. Accordingly, massed machine-readable media are not transitory propagating signals. Specific examples of massed machine-readable media may include non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 2624 may further be transmitted or received over a communications network 2626 using a transmission medium via the network interface device 2620.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A programmable integrated circuit comprising:
    an internal network on chip (iNOC) comprising iNOC rows and iNOC columns;
    a plurality of clusters coupled to the iNOC, each cluster comprising a vertical network access point (NAP) for iNOC column communications, a horizontal NAP for iNOC row communications, a valid signal, and programmable logic, wherein the vertical NAP is connected to the horizontal NAP when the valid signal is activated; and
    an Ethernet controller coupled to the iNOC, the Ethernet controller configurable to send Ethernet-packet segments to the vertical NAPs.

2. The programmable integrated circuit as recited in claim 1, wherein wires connecting the vertical NAP to the iNOC column are interleaved with wires connecting the horizontal NAP to the iNOC row.

3. The programmable integrated circuit as recited in claim 1, wherein a first cluster includes a first vertical NAP and a parser in the programmable logic, the parser analyzing a header of an inbound Ethernet packet to determine processing of the inbound Ethernet packet.

4. The programmable integrated circuit as recited in claim 3, wherein the parser sends a header of a TCP/IP Ethernet packet to a second NAP by adding an address of the second NAP as a destination of part of the TCP/IP Ethernet packet, wherein the parser sends a payload of the TCP/IP Ethernet packet to a memory via one iNOC row.

5. The programmable integrated circuit as recited in claim 4, wherein a third NAP in a third cluster is used for sending an outbound Ethernet packet, wherein the third cluster retrieves a payload of the outbound Ethernet packet from the memory and sends the outbound packet to the Ethernet controller via one of the iNOC columns.

6. The programmable integrated circuit as recited in claim 3, wherein the parser redirects the inbound Ethernet packet to a decryption engine in a fourth NAP in a fourth core via the iNOC column.

7. The programmable integrated circuit as recited in claim 3, wherein the parser redirects the inbound Ethernet packet to a decryption engine in a fifth NAP in a fifth core via one of the iNOC rows by activating the valid signal.

8. The programmable integrated circuit as recited in claim 1, wherein the Ethernet controller is configurable to operate in Quad Segment Interface (QSI) to:
    receive an inbound Ethernet packet using a first data path having a width of a first number of bits;
    break the received inbound Ethernet packet into four segments having a second number of bits; and
    send each segment to one of four NAPs in one of the iNOC columns.

9. The programmable integrated circuit as recited in claim 8, wherein the four NAPs share a decryption engine.

10. The programmable integrated circuit as recited in claim 8, wherein the four NAPs share a MOD value indicating an end of the inbound Ethernet packet.

11. A method comprising:
receiving, at a programmable integrated circuit, a configuration for the programmable integrated circuit, the programmable integrated circuit comprising:
an internal network on chip (iNOC) comprising iNOC rows and iNOC columns;
a plurality of clusters coupled to the iNOC, each cluster comprising a vertical network access point (NAP) for iNOC column communications, a horizontal NAP for iNOC row communications, a valid signal, and programmable logic, wherein the vertical NAP is connected to the horizontal NAP when the valid signal is activated; and
an Ethernet controller coupled to the iNOC, the Ethernet controller configurable to send Ethernet-packet segments to the vertical NAPs; and
providing Ethernet communications for the plurality of clusters via the Ethernet controller.

12. The method as recited in claim 11, wherein wires connecting the vertical NAP to the iNOC column are interleaved with wires connecting the horizontal NAP to the iNOC row.

13. The method as recited in claim 11, wherein a first cluster includes a first vertical NAP and a parser in the programmable logic, the method further comprising:
analyzing, by the parser, a header of an inbound Ethernet packet; and
processing the inbound Ethernet packet based on the analysis by the parser.

14. The method as recited in claim 13, further comprising:
sending, by the parser, a header of an TCP/IP Ethernet packet to a second NAP by adding an address of the second NAP as destination of part of the TCP/IP Ethernet packet; and
sending, by the parser, a payload of the TCP/IP Ethernet packet to a memory via one iNOC row.

15. The method as recited in claim 13, further comprising:
redirecting, by the parser, the inbound Ethernet packet to a decryption engine in a fourth NAP in a fourth core via the iNOC column.

16. A non-transitory machine-readable storage medium including instructions that, when executed by a machine, cause the machine to perform operations comprising:
programming a programmable integrated circuit based on a configuration for the programmable integrated circuit, the programmable integrated circuit comprising:
an internal network on chip (iNOC) comprising iNOC rows and iNOC columns;
a plurality of clusters coupled to the iNOC, each cluster comprising a vertical network access point (NAP) for iNOC column communications, a horizontal NAP for iNOC row communications, a valid signal, and programmable logic, wherein the vertical NAP is connected to the horizontal NAP when the valid signal is activated; and
an Ethernet controller coupled to the iNOC, the Ethernet controller configurable to send Ethernet-packet segments to the vertical NAPs; and
providing Ethernet communications for the plurality of clusters via the Ethernet controller.

17. The non-transitory machine-readable storage medium as recited in claim 16, wherein wires connecting the vertical NAP to the iNOC column are interleaved with wires connecting the horizontal NAP to the iNOC row.

18. The non-transitory machine-readable storage medium as recited in claim 16, wherein a first cluster includes a first vertical NAP and a parser in the programmable logic, wherein the machine further performs operations comprising:
analyzing, by the parser, a header of an inbound Ethernet packet; and
processing the inbound Ethernet packet based on the analysis by the parser.

19. The non-transitory machine-readable storage medium as recited in claim 18, wherein the machine further performs operations comprising:
sending, by the parser, a header of an TCP/IP Ethernet packet to a second NAP by adding an address of the second NAP as destination of part of the TCP/IP Ethernet packet; and
sending, by the parser, a payload of the TCP/IP Ethernet packet to a memory via one iNOC row.

20. The non-transitory machine-readable storage medium as recited in claim 18, wherein the machine further performs operations comprising:
redirecting, by the parser, the inbound Ethernet packet to a decryption engine in a fourth NAP in a fourth core via the iNOC column.

* * * * *

UNITED STATES PATENT AND TRADEMARK OFFICE
CERTIFICATE OF CORRECTION

PATENT NO. : 10,936,525 B2
APPLICATION NO. : 16/852967
DATED : March 2, 2021
INVENTOR(S) : Orthner et al.

Page 1 of 1

It is certified that error appears in the above-identified patent and that said Letters Patent is hereby corrected as shown below:

In the Specification

In Column 6, Line 14, delete "112." and insert --112,-- therefor

In Column 6, Line 61, delete "non-AX" and insert --non-AXI-- therefor

In Column 9, Line 31, delete "Ethernet." and insert --Ethernet,-- therefor

In Column 15, Line 42, delete "200G." and insert --200G,-- therefor

In Column 17, Line 20, delete "B" and insert --B1-- therefor

In Column 17, Line 56, delete "A1." and insert --A1,-- therefor

In Column 17, Line 57, delete "muliplexer" and insert --multiplexer-- therefor

In Column 18, Line 2, delete "muiplexer" and insert --multiplexer-- therefor

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*